United States Patent [19]
Perrott et al.

[11] Patent Number: 6,008,703
[45] Date of Patent: *Dec. 28, 1999

[54] DIGITAL COMPENSATION FOR WIDEBAND MODULATION OF A PHASE LOCKED LOOP FREQUENCY SYNTHESIZER

[75] Inventors: Michael H. Perrott, Cambridge; Charles G. Sodini; Anantha P. Chandrakasan, both of Belmont, all of Mass.

[73] Assignee: Massachusetts Institute of Technology, Cambridge, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/791,215

[22] Filed: Jan. 31, 1997

[51] Int. Cl.[6] .............................. H03C 3/00; H03L 7/18; H03L 27/12
[52] U.S. Cl. ........................... 332/100; 331/23; 331/16; 375/303
[58] Field of Search .................................. 332/100–102; 331/16, 18, 23, 25; 375/303–307, 376

[56] References Cited

U.S. PATENT DOCUMENTS

| | | | |
|---|---|---|---|
| 4,068,199 | 1/1978 | Madoff | 332/19 |
| 4,074,209 | 2/1978 | Lysobey | 332/19 |
| 4,242,649 | 12/1980 | Washburn, Jr. | 332/18 |
| 4,313,209 | 1/1982 | Drucker | 445/112 |
| 4,321,706 | 3/1982 | Craft | 375/59 |

(List continued on next page.)

FOREIGN PATENT DOCUMENTS

| | | | |
|---|---|---|---|
| 0408238 | 1/1991 | European Pat. Off. | H03C 3/09 |
| 0713306 | 5/1996 | European Pat. Off. | H04L 27/12 |
| 0718963 | 6/1996 | European Pat. Off. | H03C 3/09 |
| 9011643 | 10/1990 | WIPO | H03C 3/09 |

OTHER PUBLICATIONS

Riley et al., "A Simplified Continuous Phase Modulator Technique," *IEEE Trans. on Circuits and Systems II: Analog and Digital Signal Processing*, V. 41, N. 5, May, 1994. pp. 321–328.

Perrott et al., "A 27 mW CMOS Fractional–N Synthesizer/Modulator IC," Digest of Tech. Papers, *IEEE ISSCC '97*, V. 40, 1st Edition, pp. 366, 367, 487, Feb. 6–8, 1997.

(List continued on next page.)

*Primary Examiner*—David Mis
*Attorney, Agent, or Firm*—Theresa A. Lober

[57] ABSTRACT

A digital compensation filtering technique is provided that enables indirect phase locked loop modulation with a digital modulation data stream having a bandwidth that exceeds, perhaps by an order of magnitude, the bandwidth characteristic of the phase locked loop. A modulation data receiver is provided for receiving from a modulation source digital input modulation data having a bandwidth that exceeds the cutoff frequency characteristic of the phase locked loop frequency response. A digital processor is coupled to the modulation data receiver for digitally processing the input modulation data to amplify modulation data at frequencies higher than the phase locked loop cutoff frequency. This digital processor is connected to the phase locked loop frequency divider to modulate the divider based on the digitally-processed input modulation data, whereby a voltage controlled oscillator of the phase locked loop is controlled to produce a modulated output carrier signal having a modulation bandwidth that exceeds the phase locked loop cutoff frequency. The digital processing of the modulation data can be implemented by adapting a digital FIR Gaussian transmit filter such that its filter characteristic reflects the intended modulation data amplification as well as enables Gaussian Frequency Shift Keyed modulation. With this implementation, no additional componentry beyond the PLL system is needed to implement the digital modulation data processing provided by the invention.

25 Claims, 13 Drawing Sheets

U.S. PATENT DOCUMENTS

| | | | |
|---|---|---|---|
| 4,581,749 | 4/1986 | Carney et al. | 375/44 |
| 4,660,182 | 4/1987 | Bates et al. | 367/3 |
| 4,743,867 | 5/1988 | Smith | 332/16 R |
| 4,810,977 | 3/1989 | Flugstad et al. | 332/19 |
| 4,864,257 | 9/1989 | Vandegraaf | 332/125 |
| 4,866,404 | 9/1989 | Vandegraaf | 332/127 |
| 4,926,144 | 5/1990 | Bell | 332/124 |
| 4,965,531 | 10/1990 | Riley | 332/127 X |
| 4,994,768 | 2/1991 | Shepherd et al. | 332/127 |
| 5,055,802 | 10/1991 | Hietala et al. | 331/16 |
| 5,079,522 | 1/1992 | Owen et al. | 331/16 |
| 5,097,230 | 3/1992 | Lautzenhiser | 332/127 |
| 5,130,676 | 7/1992 | Mutz | 332/100 |
| 5,337,024 | 8/1994 | Collins | 332/127 |
| 5,412,353 | 5/1995 | Chaplik et al. | 332/127 |
| 5,436,589 | 7/1995 | La Rosa et al. | 329/302 |

OTHER PUBLICATIONS

Perrott et al., "A 27–mW CMOS Fractional–N Synthesizer Using Digital Compensation for 2.5–Mb/s GFSK Modulation," *IEEE Jnl. Solid–State Cir*, V. 32, N. 12, pp. 2048–2060, Dec. 1997.

Riley et al., "A Simplified Continuous Phase Modulator Technique," *IEEE Trans. on Circuits & Systems II: Analog and Digital Signal Processing*, Vol. 41, No. 5, pp. 321–328, May 1994.

Thamsirianunt et al., "A 1.2 $\mu$m CMOS Implementation of a Low–Power 900–MHz Mobile Radio Frequency Synthesizer," IEEE 1994 Custom Integrated Circuits Conference, pp. 383–386, 1994.

*Oversampling Delta–Sigma Data Converters*, Candy et al., Editors, IEEE Press, Piscataway, New Jersey, 1991. pp. iii–vii.

W(f) GAUSSIAN TRANSMIT FILTER GAIN (dB) vs FREQUENCY (logHz), B

DIGITAL COMPENSATION FILTER GAIN (dB) vs FREQUENCY (logHz), $f_0$, B

Wc(f) COMPENSATED GAUSSIAN TRANSMIT FILTER GAIN (dB) vs FREQUENCY (logHz), $f_0$, B

DIGITAL COMPENSATION FOR WIDEBAND MODULATION OF A PHASE LOCKED LOOP FREQUENCY SYNTHESIZER

GOVERNMENT RIGHTS IN THE INVENTION

The United States Government has rights to this invention pursuant to DARPA Contract No. DAAL01-95-K-3526.

BACKGROUND OF THE INVENTION

This invention relates to frequency synthesis techniques that employ a phase locked loop, and more particularly relates to techniques for modulating a phase locked loop frequency synthesizer.

Modern communication transmitters traditionally employ a phase locked loop for frequency synthesis of a communication carrier signal modulated with transmission data. The phase locked loop enables the carrier signal frequency to be precisely controlled and accordingly enables the data on which the carrier signal modulation is based to be reliably transmitted at a stable, known frequency. In such a phase locked loop (PLL) frequency synthesizer, a voltage controlled oscillator (VCO) produces the output carrier signal at the desired frequency based on a VCO frequency control signal. In a simplified PLL configuration, this control is achieved by a feedback loop, with the VCO output signal coupled via the feedback loop to a phase-frequency detector which compares the VCO signal phase or frequency to that of a fixed-frequency reference signal and produces a frequency control signal corresponding to the phase difference between the VCO signal and the fixed-frequency signal. This frequency control signal is smoothed by a low pass loop filter and then applied to the VCO such that in its steady state the VCO output signal frequency matches that of the fixed-frequency reference signal.

Typically, a frequency divider is included in the PLL feedback loop to enable division of the frequency of the VCO output signal to a frequency that is a multiple of that of a fixed-frequency reference source. The output of the frequency divider is compared by the phase-frequency detector to the fixed-frequency source for controlling the VCO phase. In this way, the frequency of a carrier signal produced by the VCO is constantly controlled such that it is "phase locked" to a multiple of that of the fixed-frequency reference.

There exist a wide range of techniques for modulating a PLL-synthesized carrier signal. In a first general class of such techniques, hereinafter referred to as direct open-loop modulation, a modulation data stream is directly applied to the VCO, or to an appropriate node in the PLL that enables access to the VCO, for a time period during which the PLL feedback loop is broken, for adjusting the VCO frequency control signal to account for the modulation In this direct open-loop PLL modulation scenario, the PLL sets the carrier frequency during times that modulation is not performed, to control carrier frequency accuracy. But the required break in the PLL feedback loop during modulation limits this modulation technique to only burst mode communication because the PLL feedback must be periodically closed to permit this carrier frequency realignment by the closed PLL feedback. This modulation technique is further limited in that while the loop is open, great care must be taken to achieve high isolation of the VCO input from undesirable perturbations, and the leakage current must be minimized to achieve a desirable level of drift.

There has been proposed a second general class of PLL modulation that overcomes many of the limitations of a direct open-loop PLL modulation technique. In this second class, hereinafter referred to as closed-loop modulation, a modulation data stream is directly applied to the VCO or a node in the PLL enabling access to the VCO, or is indirectly applied to the PLL by way of the PLL frequency divider, in either case without breaking the PLL feedback loop, for adjusting the VCO frequency control signal to account for the modulation. For example, Washburn, in U.S. Pat. No. 4,242,649; Vandegraaf, in U.S. Pat. No. 4,864,257; and Mutz, in U.S. Pat. No. 5,130,676; all describe closed-loop PLL modulation techniques in which a modulation signal is directly applied to the VCO frequency control signal in a closed feedback loop for modulating the VCO output signal. Riley, in U.S. Pat. No. 4,965,531; Hietala et al., in U.S. Pat. No. 5,055,802; and Shepherd et al., in U.S. Pat. No. 4,994,768; describe application of a digital modulation data stream to a closed-loop PLL frequency divider for modulating the divide value of the divider and thus the PLL.

Direct or indirect closed-loop PLL modulation is recognized to be primarily limited in that the frequency response of a given PLL imposes a bandwidth constraint on modulation data to be applied to the PLL in a closed-loop configuration. For example, the bandwidth of closed-loop direct modulation to the VCO is impacted by the high pass nature of the PLL components effecting the VCO, while the bandwidth of both closed-loop indirect modulation and closed-loop direct modulation at a point ahead of the low pass filter are impacted by the low pass nature of this filter. In this second scenario, the bandwidth, and corresponding data rate, of the modulation data stream must be of the same order or less than the bandwidth of the PLL, in its basic configuration, to enable the PLL dynamics to fully accommodate the data stream, i.e., to ensure that the data stream is not attenuated by the characteristic low pass nature of the transfer function of the PLL. But while a PLL is typically characterized by a bandwidth up to about the kilohertz range, many communications applications require a modulation data stream bandwidth in the megahertz range.

In an effort to mitigate this bandwidth discrepancy, there have been proposed various modulation compensation circuits designed to compensate for relatively low PLL bandwidth and enable wider bandwidth closed-loop PLL modulation. For example, Washburn, in U.S. Pat. No. 4,242,649; Druker, in U.S. Pat. No. 4,313,209; and Vandegraaf, in U.S. Pat. No. 4,864,257; describe analog operational amplifier circuits designed for use in direct closed-loop PLL modulation techniques to impose on the modulation data an additional transfer function having a frequency response that tends to counter that of the PLL transfer function. Mutz, in U.S. Pat. No. 5,130,676, alternatively proposes generation of an analog compensation signal, based on a given modulation data signal, to be applied to the PLL fixed-frequency reference signal for causing the PLL dynamics to accommodate the modulation data bandwidth.

Like these compensation circuits, the many other techniques proposed for reducing the modulation data-PLL bandwidth discrepancy of closed-loop modulation scenarios generally require additional, specialized analog componentry beyond the PLL componentry, and thus are subject to tolerance variation and are sensitive to process and temperature variations, due to their analog nature. In addition, analog compensation circuits that pre-amplify analog modulation data also amplify undesired noise and thus degrade the PLL performance. The analog compensation circuits also generally require additional power beyond that required of the PLL, and present challenges in producing a PLL system that is entirely integrated. But for many PLL communication applications such operational and manufacturing complications are impractical, due to, e.g., performance, packaging, and power requirements inherent in the application. As a result, strict bandwidth limits must be imposed on the modulation data to be handled by the PLL modulation systems for these applications.

SUMMARY OF THE INVENTION

The present invention overcomes limitations of prior PLL bandwidth compensation circuits by providing a digital compensation filtering technique that enables indirect phase locked loop modulation with a digital modulation data stream having a bandwidth that can exceed by even an order of magnitude the bandwidth of the phase locked loop. The invention accordingly provides a PLL modulator for modulating a phase locked loop characterized by a frequency response having a characteristic cutoff frequency. The phase locked loop here includes a voltage controlled oscillator responsive to a control signal for generating an output carrier signal that is modulated by input modulation data and that has a controlled frequency. A reference frequency signal source is included in the PLL, as well as a phase comparator connected to receive a reference frequency signal and the modulated output carrier signal for generating a difference signal. A low pass loop filter is connected to filter the difference signal for producing the voltage controlled oscillator control signal. The PLL includes a frequency divider connected between the voltage controlled oscillator output and the phase comparator for dividing the output carrier signal frequency.

The invention provides a modulation data receiver for receiving from a modulation source digital input modulation data having a bandwidth that exceeds the cutoff frequency of the phase locked loop frequency response. A digital processor is coupled to the modulation data receiver for digitally processing the input modulation data to amplify modulation data at frequencies higher than the phase locked loop cutoff frequency. This digital processor is connected to the phase locked loop frequency divider to modulate the divider based on the digitally-processed input modulation data, whereby the voltage controlled oscillator is controlled to produce a modulated output carrier signal having a modulation bandwidth that exceeds the phase locked loop cutoff frequency.

In one embodiment, the phase locked loop frequency response cutoff frequency is less than about 1.0 MHz and the carrier signal modulation bandwidth is greater than about 1.0 MHz. This modulation capability provided by the invention enables the phase locked loop frequency response to be designed for a given noise performance criteria, with the cutoff frequency set to meet that criteria, while enabling high frequency data modulation. In other words, for a given noise criteria, the digital modulation data amplification technique provided by the invention enables a PLL to produce a carrier signal having a modulation bandwidth that is much larger than that enabled by a conventional PLL configuration designed for the same noise criteria.

In preferred embodiments, the input modulation data is amplified at frequencies higher than the phase locked loop cutoff frequency by a selected gain factor that corresponds to an attenuation factor characteristic of the phase locked loop frequency response at frequencies higher than the phase locked loop cutoff frequency. This frequency response attenuation factor is in one embodiment based on a dominant pole in the phase locked loop frequency response, and is produced by a dominant pole in the low pass loop filter.

In embodiments provided by the invention, the digital processing of the input modulation data is accomplished by a digital finite impulse response compensation filter having a compensation frequency response characterized by the selected gain factor at frequencies higher than the phase locked loop cutoff frequency. In addition, there can be provided a digital finite impulse response Gaussian filter having a Gaussian frequency response characterized by a cutoff frequency that corresponds to the digital modulation data bandwidth, for filtering the digital input modulation data to enable Gaussian-Frequency-Shift-Keyed modulation of the voltage controlled oscillator output carrier signal. Alternatively, the digital finite impulse response compensation filter can be adapted to have a compensated Gaussian frequency response corresponding to a convolution of the compensation frequency response with a Gaussian frequency response characterized by a cutoff frequency that corresponds to the digital modulation data bandwidth, for filtering the digital input modulation data to enable Gaussian-Frequency-Shift-Keyed modulation of the voltage controlled oscillator output carrier signal. In any of these implementations, the digital finite impulse response compensation filter can be implemented as a digital read-only-memory circuit having a stored look-up-table for mapping a given digital modulation data sample input to the circuit to a corresponding filtered output digital modulation data value based on a convolution of the given digital modulation data sample with the digital finite impulse compensation frequency response.

In other embodiments provided by the invention, the phase locked loop frequency divider is implemented as a multi-modulus frequency divider connected to receive the digitally-processed digital input modulation data for modulating the divider modulus. In one preferred embodiment, the multi-modulus frequency divider is a fractional-N synthesizer, where N is the frequency divider modulus; and can include a digital Σ-Δ modulator connected to receive the digitally-processed digital input modulation data for producing a modulated digital modulus control signal, with the multi-modulus divider connected to receive the control signal for controlling the divider modulus. Preferably, the digital Σ-Δ modulator is implemented as a cascade of digital Σ-Δ modulator loops, each loop of an order, L, that is less than an order, M, of the cascade of loops together, with the cascade producing the modulated digital modulus control signal. The cascade of digital Σ-Δ modulator loops preferably is a pipelined cascade of digital Σ-Δ modulator loops, each cascaded loop including a delay for accommodating pipelining of the production of the modulated digital modulus control signal.

In other embodiments of the invention, the low pass loop filter is implemented as an analog filter circuit having a characteristic RC time constant that produces the first-order pole in the phase locked loop frequency response. This analog filter circuit can include a switched-capacitor network for producing the low pass filter RC time constant. In other embodiments, an open loop gain controller is connected to the low pass loop filter in the PLL for adjusting open loop gain of the phase locked loop to obtain a pre-specified phase locked loop frequency response.

As will be clear from the description to follow, an extensive range of communications applications, e.g., wireless computing applications and wireless telephony applications, both those designed to meet the Digital European Communications Transmission (DECT) standard and the North American PCS band standard, as well as those applications not necessarily limited to the DECT standard, are addressed by the digital modulation data compensation technique of the invention. As will be explained in detail below, the technique can be elegantly incorporated in a given PLL modulation system without the need for any extra componentry or specialized reconfiguration. Other features and advantages will be apparent from the claims, from the description, and from the accompanying drawings.

DETAILED DESCRIPTION OF THE INVENTION

Figure 1:
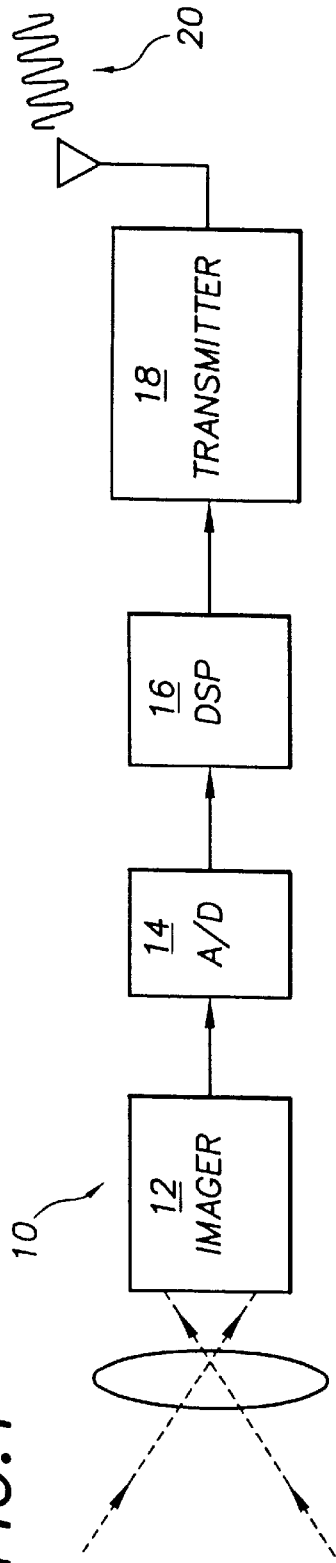
FIG. 1 is a schematic diagram of a wireless digital video system to which the digital PLL bandwidth compensation technique of the invention can be applied.

A phase locked loop in which the digital compensation technique of the invention is implemented can be employed in a wide range of applications, for example, in a wireless digital video transmission system like that shown in FIG. 1. Such a wireless digital video system 10 might include, e.g., an imager 12 for producing an analog image, an analog-to-digital converter (A/D) 14 for digitizing the analog image, a digital signal processor (DSP) 16 for performing various image enhancements, and a transmitter 18 for wireless transmission of a corresponding image signal 20 to a remote location. Typically the transmitted image signal is formed by modulating a carrier signal whose frequency is controlled by a phase locked loop included in the transmitter. Wireless transmission applications such as this one require a transmission carrier signal frequency of 1.8 GHz if they are to meet the Digital European Communications Transmission (DECT) standard and the North American PCS band standard, and frequently need to accommodate digital modulation data rates greater than 1 Mbit/s to meet desired performance levels. Such performance levels are particularly important for, e.g., wireless modem and telephone applications.

The digital compensation technique of the invention enables a particularly elegant implementation of a phase locked loop for use in a transmitter that can accommodate both the DECT carrier signal requirement and a high data rate, typical of applications such as digital video, that may exceed the phase locked loop bandwidth. As will be understood from the description to follow, an extensive range of other communications applications, e.g., wireless computing applications and wireless telephony applications, not necessarily to the DECT standard, can also be addressed by the compensation technique of the invention.

Figure 2A:
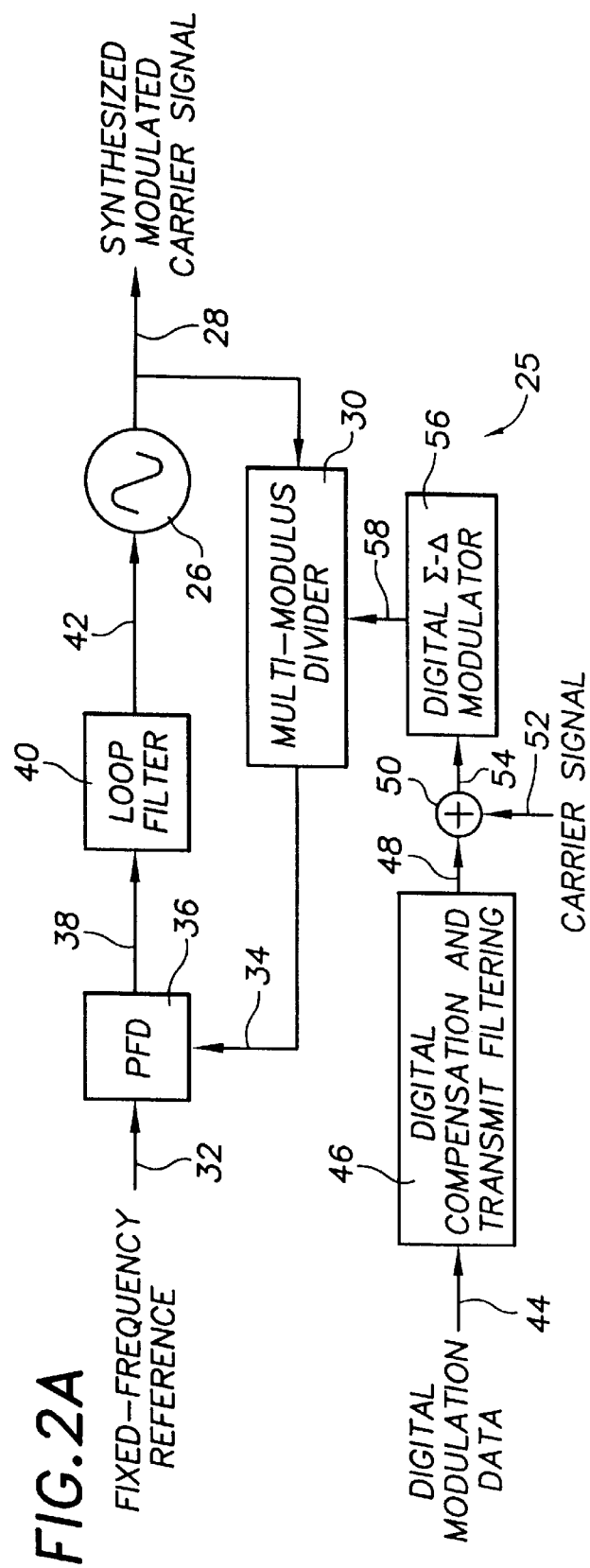
FIG. 2A is a schematic diagram of a phase locked loop frequency synthesizer including the digital modulation compensation technique of the invention.

Referring to FIG. 2A, there is shown one example implementation of a phase locked loop (PLL) 25 employing the digital compensation technique of the invention. The PLL, includes a voltage controlled oscillator (VCO) 26 the output of which is a modulated carrier signal 28 having a frequency that is synthesized by the PLL. This output carrier signal 28 can be directed to a transmission port (not shown) for wireless transmission of the signal, and is also coupled to a multi-modulus divider 30 for dividing the carrier signal frequency to produce a desired frequency that is a multiple of a fixed-frequency reference signal 32. The fixed-frequency signal 32 and a divided-frequency carrier signal 34 from the divider 30 are compared by a phase-frequency detector (PFD) 36, which produces a control signal 38 corresponding to the phase difference between the two signals. As is conventional, the PFD 36 is also capable of distinguishing frequency differences between the two signals. The control signal 38 produced by the PFD is smoothed by a low pass loop filter 40 and the smoothed control signal 42 is then applied to the VCO 26, whereby in the steady state, the frequency of the output signal 28 of the VCO is controlled to accurately correspond to a multiple of the fixed-frequency reference signal 32.

The carrier signal for which PLL frequency synthesis is to be provided, as well as the carrier signal modulation data, are in a preferred embodiment of the invention together introduced to the PLL indirectly by way of the multi-modulus divider 30, as shown in the figure. In this scenario, a binary data sequence 44, derived from a modulation data source, e.g., a digital imager, is accepted and input to a digital processor 46 for processing that data to accomplish digital compensation and transmission filtering in accordance with the invention, as described below, and the filtered digital modulation output 48 is then summed 50 with a carrier signal 52. The resulting modulated carrier signal 54 is then directed to a digital $\Sigma$-$\Delta$ modulator 56, which produces a corresponding divider value control signal 58 to be applied to the multi-modulus divider 30 for frequency synthesis by the PLL. The frequency-synthesized output signal 28 from the VCO is correspondingly then a carrier signal having an output frequency that changes as a function of the modulation data, in a form of, e.g., Frequency Shift Keyed (FSK) modulation.

It is the digital compensation and transmit filtering functionality 46 that enables indirect PLL modulation with modulation data having a bandwidth and corresponding data rate that may exceed the bandwidth of the PLL frequency response. Implementation of this digital filtering functionality in accordance with the invention thus is preferably selected based directly on the frequency response bandwidth of a given PLL implementation for a selected application.

Figure 2B:
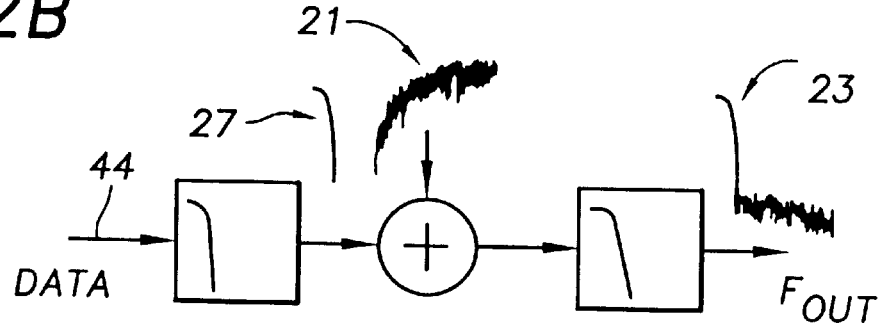
FIG. 2B is a schematic diagram illustrating a frequency response for the phase locked loop of FIG. 2A to attenuate quantization noise introduced to the loop.

In general, however, the frequency response, or transfer function, G(f), of a PLL, taken between an input at the multi-modulus divider 30 and an output at the VCO 26, and the cutoff frequency, $f_o$, or 3 dB point, of this transfer function, are determined by the frequency response, H(f), of the PLL loop filter (40 in FIG. 2A). Typically, the loop filter is implemented as a low pass filter, because the low frequency content of the PFD phase difference signal 38 contains information for controlling the VCO phase, while the high frequency content of the phase difference signal contains harmonics that introduce undesirable, spurious phase noise at the VCO output. Referring also to FIG. 2B, the digital $\Sigma$-$\Delta$ modulator (56 in FIG. 2A) also introduces high-frequency noise 21 directly related to the quantization noise spectrum of the $\Sigma$-$\Delta$ modulator, described in detail below. Thus, the overall PLL transfer function, G(f), 23 for a closed-loop, indirect PLL modulation implementation, is typically low pass in nature to attenuate undesirable high-frequency noise spectra.

The selection of a cutoff frequency, $f_o$, for the low pass PLL transfer function typically requires a tradeoff between attenuation of the undesired PLL noise and accommodation of a desired digital modulation data rate, or characteristic frequency filter response (27 in FIG. 2B) that may be higher in frequency than the noise; ideally the modulation rate should be accommodated while spurious noise is simultaneously attenuated. But as a practical matter, these competing performance criteria can not be simultaneously and adequately met by PLL loop componentry and configurations alone; indeed, the peripheral analog bandwidth compensation circuits proposed in the past have required additional external analog circuitry, and have proved suboptimal in their implementation.

The digital compensation technique of the invention provides a solution for achieving both PLL noise attenuation and high data rate modulation that can be accommodated by a low pass PLL transfer function having a cutoff frequency less than that of the data rate bandwidth. Further, as will be explained in detail below, the digital compensation technique can be elegantly incorporated in a given PLL modulation implementation without the need for any extra componentry or specialized reconfiguration.

In the digital compensation technique of the invention, digital filtering of modulation data is carried out prior to its introduction to the PLL to digitally compensate for attenuation by the PLL dynamics above the cutoff frequency of the PLL transfer function, so that high frequency PLL attenuation can be set to achieve desired attenuation of high frequency $\Sigma$-$\Delta$ modulation noise and other spurious noise. This enables implementation of a PLL having a transfer function that is optimized for noise attenuation but that accommodates the high data rates characteristic of many communications applications. The digital filtering imposes on the modulation data a transfer function that is based on the inverse of the PLL transfer function at frequencies greater than the PLL transfer function cutoff frequency and up to at least the cutoff frequency of the modulation data bandwidth.

Figure 3A:
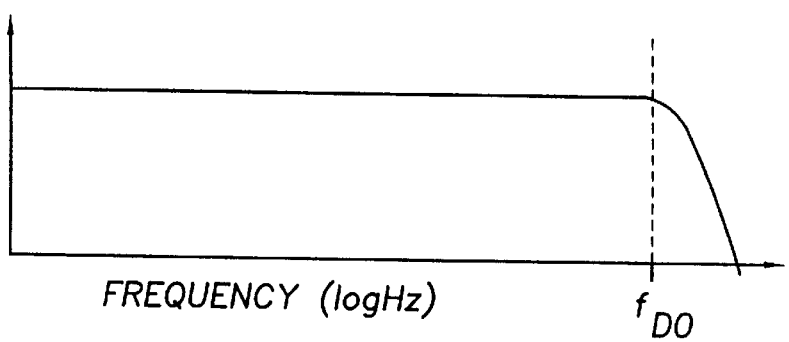
FIG. 3A is a plot of the frequency filter response of characteristic digital modulation data for indirect modulation of a phase locked loop in accordance with the invention.
Figure 3B:
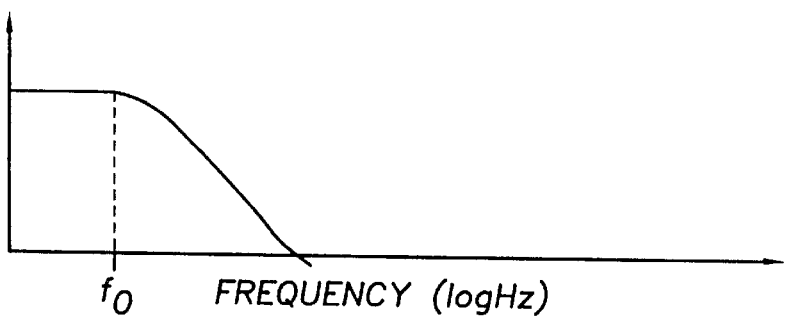
FIG. 3B is a plot of the frequency response of a characteristic phase locked loop to which indirect digital modulation is to be applied.
Figure 3C:
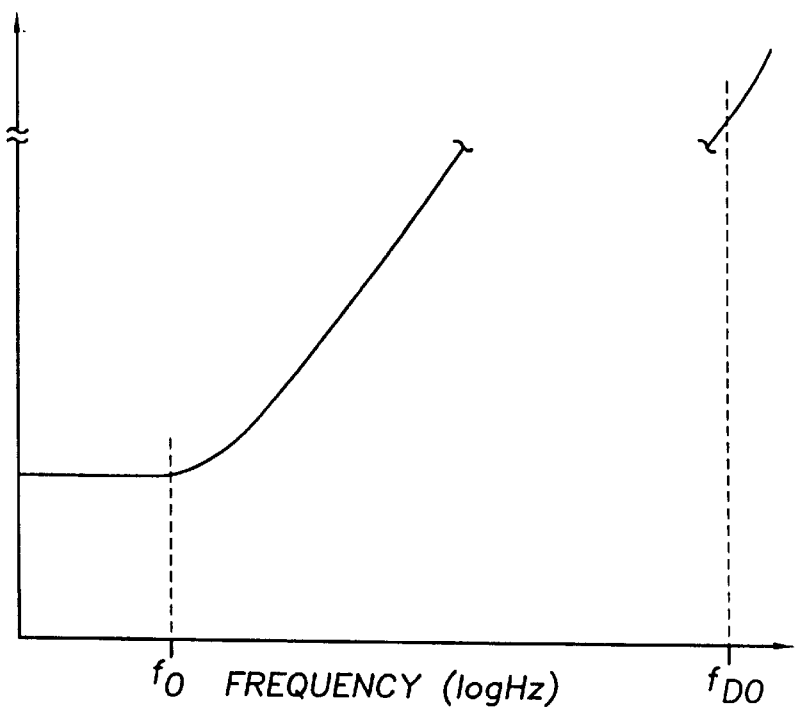
FIG. 3C is a plot of the frequency response of the digital compensation filter provided by the invention to compensate for the bandwidth of the phase locked loop frequency response in FIG. 3B, given that the frequency, f, is much less than the modulation data sampling rate, 1/T.

Given a digital modulation data bandwidth, as shown in FIG. 3A, characterized by a high-frequency cutoff frequency, $f_{Do}$, and given a PLL transfer function having a high-frequency cutoff frequency, $f_o$, as shown in FIG. 3B, that may be an order of magnitude or more lower than $f_{Do}$, the digital filter of the invention provides a transfer function, shown in FIG. 3C, having an amplification factor that is the inverse of the PLL transfer function attenuation factor above the PLL transfer function cutoff frequency, $f_o$, continuing in frequency up to at least the modulation data bandwidth cutoff frequency, $f_{Do}$.

Figure 4:
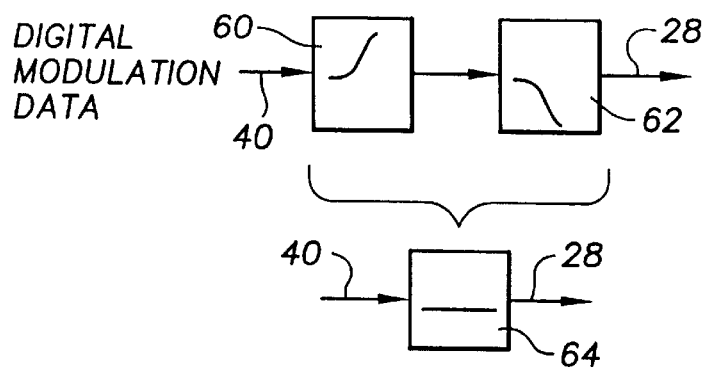
FIG. 4 is a schematic diagram of the frequency responses of a characteristic phase locked loop and the digital compensation filter of the invention and the overall frequency response produced by convolution of the phase locked loop and compensation filter frequency responses, given that the frequency, f, is much less than the modulation data sampling rate, 1/T.

The digital filter of the invention is preferably implemented in conjunction with the transmit filter conventionally included in a PLL modulation system such that, as shown in FIG. 4, the digital filter transfer function 60 is cascaded with the PLL transfer function 62 between the digital modulation data 40 input and the PLL output of the frequency-synthesized modulated carrier signal 28. This cascade of the digital filter and PLL transfer functions produces an overall cascade transfer function 64 that is flat across the bandwidth of the modulation data, i.e., that compensates for the attenuation of the modulation data by the PLL at high frequencies.

For example, given an ideal, second-order PLL transfer function, G(f), as:

$$G(f) = \frac{1}{1 + \frac{jf}{f_o Q} + \left(\frac{jf}{f_o}\right)^2}; \quad (1)$$

the corresponding digital compensation transfer function, C(f), implemented in accordance with the invention, is given as:

$$C(f) = 1 + \frac{jf}{f_o Q} + \left(\frac{jf}{f_o}\right)^2; \quad (2)$$

given that f is much less than the digital data sampling rate, 1/T, and where Q is the quality factor of the PLL transfer function and $f_o$ is the cutoff frequency of the PLL transfer function.

Figure 5A:
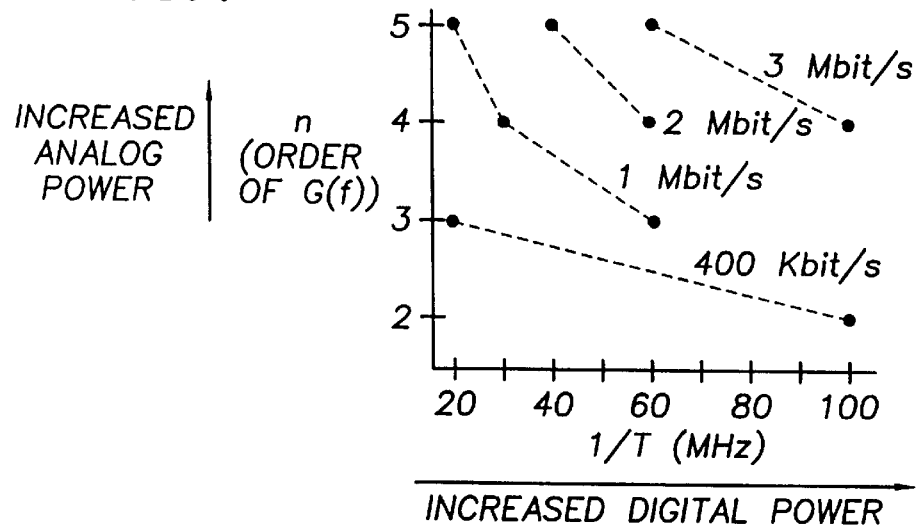
FIG. 5A is a theoretical plot of phase locked loop order as a function of phase locked loop sample rate at a given level of noise performance for four selected modulation data rates and a phase locked loop in which the digital bandwidth compensation of the invention has not been implemented.
Figure 5B:
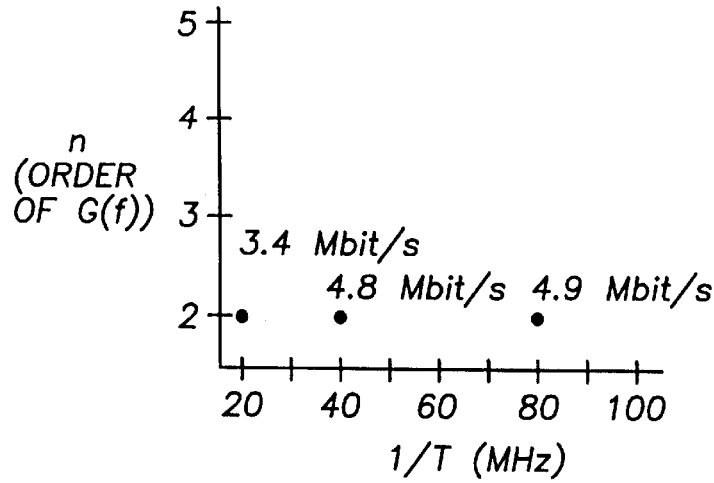
FIG. 5B is a theoretical plot of phase locked loop order as a function of phase locked loop sample rate at a given level of noise performance for three selected modulation data rates and a phase locked loop in which the digital bandwidth compensation of the invention has been implemented.

The enhanced PLL modulation bandwidth performance enabled by this compensation function is characterized in the plots of FIGS. 5A–5B. First, FIG. 5A is a theoretical plot of PLL transfer function order, n, as a function of digital data modulation sample rate, 1/T, that is required for accommodating different modulation data rates, $T_d$, namely, 400 Kbit/s, 1 Mbit/s, 2 Mbit/s, and 3 Mbit/s; all for a PLL that does not include the digital compensation of the invention, but that is required to have an output PLL noise spectrum that is less than about −133 dBc/Hz at 5 MHz offset, in accordance with DECT standards, and given a PLL cutoff frequency, $f_o$=0.7 $T_d$. It is shown by the plot in FIG. 5A that without the digital compensation of the invention, high data rates can only be accommodated by employing a high-order PLL transfer function or a high sampling rate; as explained previously, no combination of PLL componentry can otherwise alleviate the bandwidth discrepancy. But high-order PLL transfer functions require increased analog power to implement the PLL loop filter, while an increased sampling rate requires increased digital power to implement a high-speed digital data sampler. Beyond power considerations, implementation of the PLL transfer function and the digital sampler here indicated to be required for accommodating a data rate about 1 Mbit/s are generally impractical with current technology.

Turning to FIG. 5B, there is shown a theoretical plot of PLL transfer function order, n, as a function of digital data modulation sample rate, 1/T, that is required for accommodating three different modulation data rates, $T_d$, namely, 3.4 Mbit/s, 4.8 Mbit/s, and 4.9 Mbit/s; all for a PLL that includes the digital compensation of the invention, and that is required to have an output PLL noise spectrum that is less than about −133 dBc/Hz at 5 MHz offset, in accordance with DECT standards, and given a PLL cutoff frequency, $f_o$=0.7 $T_d$. Note that for a data rate of 3.4 Mbit/s, the compensation enables the PLL order, n, to be lowered from five for the uncompensated PLL to two, and enables the sample rate, 1/T, to be lowered by about 40 MHz. Generally, for all data rates shown in FIG. 5A, the compensation technique of the invention is shown to enable a lower PLL transfer function order as well as reduced sampling rate. This in turn enables reduction of PLL power requirements and minimization of circuit complexity.

As can be recognized, it is preferable that the implemented compensation transfer function, C(f), be the precise inverse of a given PLL transfer function for which bandwidth compensation is desired. This is not always achievable as a practical matter, however; a typical PLL transfer function, G(f), can include parasitic poles and zeros due to both intentional loop characteristics as well as sensitivity to fabrication process variations and temperature fluctuations, so that an ideal compensation match cannot be implemented in practice. The invention indeed does not require a digital compensation filter that implements the precise inverse of a given PLL transfer function, but instead requires implementation of at least the dominant characteristic, e.g., the dominant pole or poles, of the PLL transfer function. As will be shown, this less precise compensation is more than adequate for providing modulation bandwidth compensation for most applications.

Considering non-ideal characteristics of an example PLL implementation, one nonideal characteristic originates from a general preference that the nominal duty cycle of the PFD output difference signal (38 in FIG. 2A) be maintained at about 50%. To maintain the 50% duty cycle under different VCO bias levels, a large DC gain is required in the transfer relation between the PFD difference signal and the VCO input control signal.

This DC gain element is typically implemented as an integrator in the PLL loop filter (40 in FIG. 2A). Given that the PLL VCO also acts as an integrator, the PLL is thus characterized as a type II feedback system. A zero must be introduced in the transfer function of such a type II system to provide loop stability; this zero in turn requires the introduction of an extra pole in the PLL transfer function to enable the PLL transfer function to be of a given selected order, n, for example, second order.

Given a second-order PLL, the resulting transfer function is found to include three poles and one zero. The three poles can be positioned in a root locus corresponding to the transfer function as a complex-conjugate pair with magnitude $f_o$ and a real-valued pole, $f_{cp}$, by selection of the loop gain and time constants. The optimal transfer function Q value is somewhat application specific, but in general, a Q value of about 0.707 leads to a well-behaved transient response and equal real and imaginary parts for the complex pole pair, where the real part is approximately equal to one-half the loop filter pole, $f_p$, and $f_p$ may be selected as $\sqrt{2}f_o$. Then, by purposefully selecting the loop filter zero, $f_z$, to be much less than the loop filter pole, $f_p$, the zero location has only a small effect on the position of the complex poles.

This results in a non-ideal PLL transfer function, G(f), given as:

$$G(f) = \frac{1 + jf/f_z}{1 + jf/f_{cp}} \left( \frac{1}{1 + \frac{jf}{f_o Q} + \left(\frac{jf}{f_o}\right)^2} \right); \quad (3)$$

this resulting second order PLL transfer function includes a parasitic pole/zero pair of $f_{cp}/f_z$ in which $f_z$ is slightly smaller than $f_{cp}$, which is much less than the cutoff frequency, $f_o$.

Depending on a selected implementation for the digital compensation filter of the invention, the parasitic pole/zero pair expressed in relation (3) above can greatly complicate that implementation. A compensation transfer function, C(f), directly corresponding to the inverse of this PLL transfer function would be characterized as a recursive, or Infinite Impulse Response (IIR) filter. If implementation of the recursive filter is to be accomplished digitally using a Read Only Memory (ROM), as is preferred in accordance with the invention, then additional digital circuitry beyond the ROM would be required to perform the recursive computation. While this additional digital circuitry could be avoided by employing a Finite Impulse Response (FIR), i.e., nonrecursive, filter approximation of the IIR filter, so that the filter could be fully implemented by a ROM, the ROM would in this case need to be orders of magnitude larger than a ROM that did not implement an inverse for the parasitic pole/zero pair of the PLL transfer function.

Beyond the parasitic pole/zero pair just described, other parasitic poles and zeros, typically of high frequency, occur in the transfer function due to, e.g., the limited frequency response of the individual PLL components such as any operational amplifiers included in the loop filter. Selective design of the PLL components can, as is conventional, result in the occurrence of these additional poles and zeros at frequencies that are much higher than the bandwidth of an intended modulation data signal, so that their influence can largely be ignored. It is thus preferred in accordance with the invention that for applications in which the PLL circuitry is to be streamlined, e.g., to reduce ROM complexity, size and corresponding cost, corresponding power requirements, and the overall PLI implementation size, a mismatch between C(f) and the inverse of G(f) be allowed for small transfer function characteristic components like small or relatively high frequency poles and zeros. For example, the precise PLL transfer function given in relation (3) above can be approximated by the ideal PLL transfer function given in relation (1) above, where the parasitic pole/zero pair is ignored, except for its influence on the gain of the compensation filter, such that an FIR filter corresponding to the ideal compensation transfer function given in relation (2) above can be implemented in a compact ROM.

It is recognized by the inventors herein that some maximum degree of mismatch can typically be accommodated, above which the intended functionality of the compensation filter is lost; and preferably, such consideration is made for a given application. In the example case just discussed, the influence of the parasitic pole is significantly reduced by its proximity to the parasitic zero in the corresponding root locus plot. In addition, the energy of modulation data, which is assumed to be at a high data rate, is characteristically much higher in frequency than the parasitic pole/zero pair, whereby the pair has little effect on the data. Thus, a nonideal compensation filter is in this case adequate for imposing an inverse of the PLL transfer function on PLL modulation data. Accordingly, for a given application and PLL implementation, the PLL transfer function constituents are preferably examined and where possible, ignored in the compensation transfer function to simplify its implementation, reduce the implementation size, and reduce the corresponding implementation cost.

Fabrication process variations and operational temperature fluctuations can impact the PLL transfer function beyond parasitic constituents that result from intentional PLL dynamics. Typically such fluctuations cannot be predictably and adequately compensated for with a digital compensation filter, which typically is implemented in ROM and thus is static, but can result in undesirable PLL operational phenomena such as intersymbol interference (ISI), in which the time extent of a digital modulation data sample, called a symbol, is found to intercept that of adjacent symbols, whereby imprecise modulation data is input to the PLL. Preferable PLL component designs, such as the PLL loop filter design, for automatically and actively compensating for process and temperature variations, will be described in detail in conjunction with the other PLL componentry, later in the discussion.

This design philosophy was employed by the inventors herein for designing a digital compensation transfer function, C(f), for compensating digital modulation data sampled at a sampling rate, 1/T, of 20 MHz, to be indirectly input to a second order PLL characterized by a cutoff frequency, $f_o$, of 84 KHz with a noise performance specification of −133 dBc/Hz at a 5 MHz offset, in accordance with the DECT standard.

Using the mathematical software processor MATLAB, by Mathworks, Inc., of Natick, Mass., an iterative root locus plotting operation was carried out on an open loop transfer function of the PLL given as $$K1 + \frac{s/f_z}{s^2(1 + s/f_p)}; \qquad (4)$$

where K, the open loop gain, is varied to create the locus, to determine the closed loop transfer function, with $f_p$ being initially set as $f_p=(2)(84\ \text{KHz})=118\ \text{KHz}$; and $f_z$ being initially set as $(1/11)f_p$, as explained earlier. The root locus was iteratively adjusted until a quality value, Q, of 0.707, and a cutoff frequency, $f_o$, for the dominant pole pair, of 84 KHz was obtained as desired. The resulting values were $f_p=127$ KHz, and $f_z=11.5$ KHz, The corresponding root locus included a parasitic low frequency pole, $f_{cp}=14$ KHz, corresponding to the gain factor described earlier.

With these values for the closed loop transfer function of the PLL, the corresponding compensation filter transfer function was designed also using a MATLAB design process. The compensation filter was given to be a compensated FIR filter of the form:

$$1 + jf/(w_o Q) + (jf)^2/f_o^2; \qquad (5)$$

for f much less than the sample rate, 1/T.

For the frequency range of interest, this corresponds to adding scaled first and second derivatives of the compensation filter's input to itself. Appendix A provides listing of the MATLAB code employed to produce the corresponding FIR filter. This example makes use of analytic derivatives but it is to be understood that the same compensation technique can be employed with an FIR filter that does not have derivatives which can be analytically expressed; in such a case, numerical methods can be employed to calculate the resulting compensation filter parameters.

Turning to implementation of the digital compensation filtering provided by the invention, in one example implementation, digital modulation data is employed in a form of Gaussian Frequency Shift Keyed (GFSK) modulation of a carrier signal whose frequency is synthesized by the PLL. To implement GFSK modulation with the PLL configuration shown in FIG. 2, a digital modulation data stream 44 is first filtered based on a Gaussian transmit filter transfer function, W(f), that has a Gaussian, low pass filter characteristic for smoothing the output phase transitions caused by the modulated data. This Gaussian transmit filter function is characterized by a cutoff frequency, B, or 3 dB bandwidth, that is set according to the modulation data rate. This transmit filter cutoff frequency is also selected based on desired spectral efficiency and allowable level of intersymbol interference that is created by the convolution of the data with the transmit filter. The source of this intersymbol interference is unrelated to that caused by mismatch, and would occur even in an ideal GFSK system. Typically the relationship between B and the data rate, $1/T_d$, is parameterized by their product, $BT_d$, and is typically set to $BT_d=0.5$ if the DECT standard is to be met, and achieves good spectral efficiency with acceptable levels of intersymbol interference.

The Gaussian transmit filter transfer function is preferably implemented in accordance with the invention as an FIR filter that is sampled with a sampling period, T, and implemented in ROM. In this scenario, the digital compensation filter of the invention is also preferably implemented as an FIR filter implemented in ROM. Then, as shown in FIG. 2A, digital modulation data 44 input to the digital processor 46 is convolved with a Gaussian pulse to smooth the resulting phase transitions, as well as being filtered by the compensation transfer function to offset the attenuation to be imposed by the PLL transfer function.

Figure 6A:
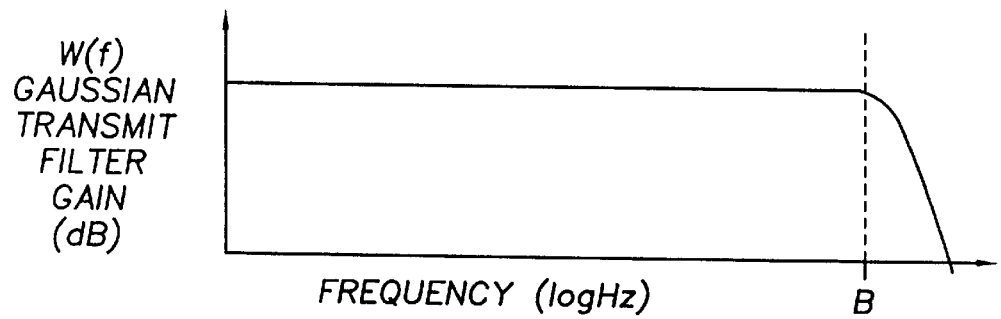
FIG. 6A is a plot of frequency response of a digital Gaussian transmit filter implemented in accordance with the invention for indirect phase locked loop modulation, given that the frequency,f is much less than the modulation data sampling rate, 1/T.
Figure 6B:
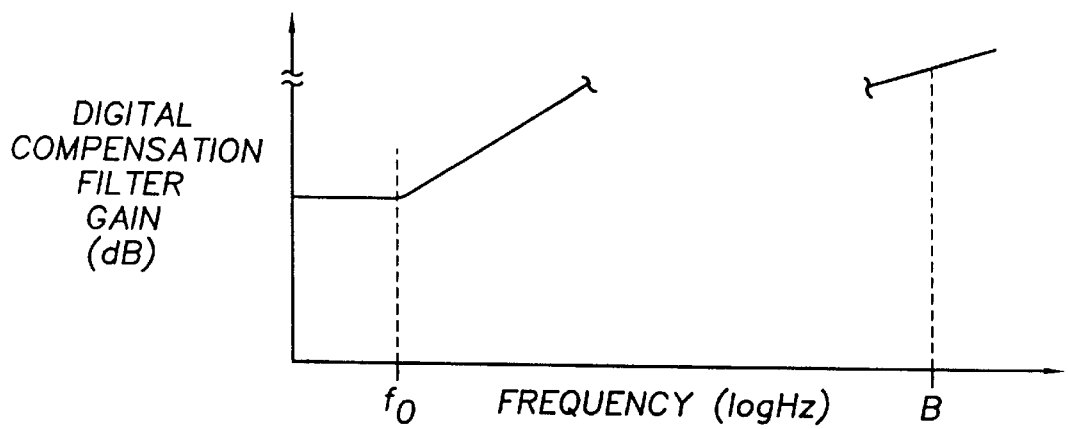
FIG. 6B is a plot of frequency response of the digital compensation filter provided by the invention shown also in FIG. 3A but here shown to the scale of FIG. 6A, and given that the frequency, f, is much less than the modulation data sampling rate, 1/T.

FIG. 6A illustrates the frequency response of the Gaussian transmit transfer function, W(f), not shown to the scale of the transfer functions in FIGS. 3A–3C. FIG. 6B illustrates the frequency response, C(f), of the digital compensation filter of the invention, shown again here for convenience and to the scale of FIG. 6A. It is preferred in accordance with the invention that for a ROM implementation of both the Gaussian transmit filter and the digital compensation filter, the transfer functions of these two filters be combined into a single filter, i.e., the Gaussian transmit filter be modified to include the digital compensation transfer function without the need for additional process componentry.

Figure 6C:
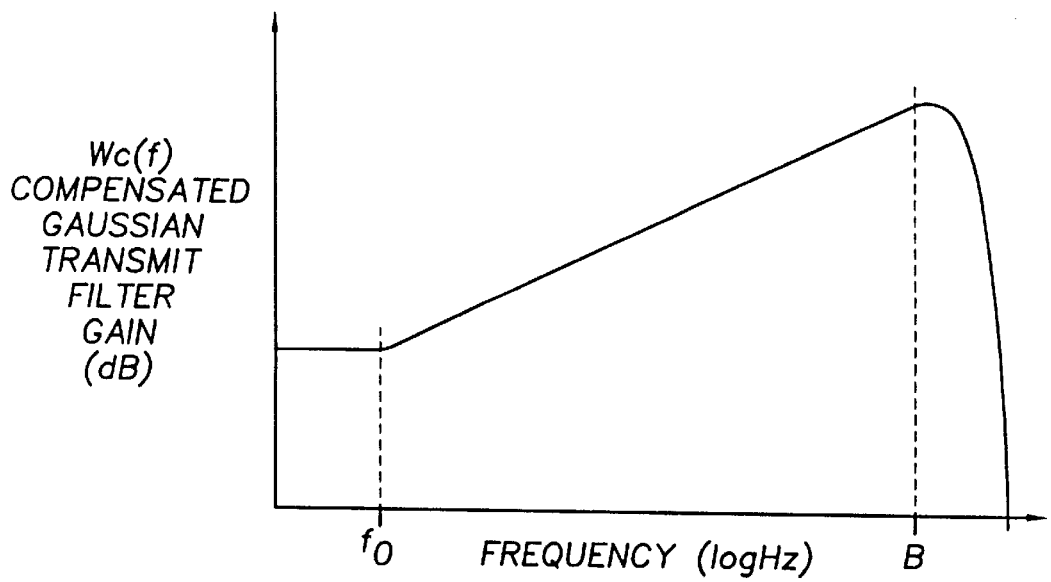
FIG. 6C is a plot of frequency response of a digital compensated Gaussian transmit filter that is adapted to include the characteristics of the digital compensation filter of the invention, and given that the frequency, f, is much less than the modulation data sampling rate, 1/T.

FIG. 6C illustrates the compensated frequency response $W_c(f)$, of the resulting compensated Gaussian transmit filter. Between the PLL transfer function cutoff frequency, $f_o$, and the Gaussian transmit filter cutoff frequency, B, the compensated transmit transfer function amplifies the modulation data to offset the PLL attenuation. Due to the characteristically steep rolloff in frequency of the Gaussian transfer function at its cutoff frequency, and the relatively less steep incline of the digital compensation transfer function at that frequency, the compensated Gaussian transfer function exhibits roughly the same bandwidth as the uncompensated Gaussian transfer function. Because a FIR implementation of the compensation transfer function, C(f), is confined to a very short period of time, then convolution of the compensation transfer function with a FIR implementation of the Gaussian transfer function, W(f), produces a compensated Gaussian transfer function, $W_c(f)$, which inherently will also be an FIR filter and which will be of a duration close to that of the original Gaussian transfer function. Modification of the Gaussian FIR filter to include the compensation transfer function therefore adds little complexity over that required for the uncompensated Gaussian FIR filter. Note that the MATLAB code of Appendix A implements the compensation filter transfer function as a compensated Gaussian transmit transfer function as described here.

It is noted that with this ROM implementation, the digital compensation of the invention does not require any additional analog or digital PLL componentry beyond that conventionally employed for a GFSK modulation implementation. In addition, it is found that the digital power required for a compensated transmit filter implementation is potentially less than the power required for an uncompensated transmit filter implementation. This somewhat counterintuitive result is illuminated by the plots of FIGS. 5A and 5B. First consideration must be given to the fact that the complexity and power required for implementing the FIR filters in ROM depend on the correspondingly required number of storage bits in the ROM as well as the speed at which those bits must be accessed. As shown in FIG. 5A, in an uncompensated transmit filter configuration, a relatively high modulation data sample rate, 1/T, is required to achieve high data rates. The sample rate, 1/T, directly corresponds to the ROM access speed, and the ratio of $1/T:1/T_d$, where $T_d$ is the data rate, corresponds to the number of samples that must be stored in the ROM. Therefore, a high sample rate leads to a high level of power usage in the ROM.

By comparison, in a compensated transmit filter configuration in accordance with the invention, the sample rate, 1/T, can be lowered in an absolute manner as well as relative to the data rate, $1/T_d$. Thus, provided that the number of bits per sample required in the ROM does not increase substantially by implementing a compensated Gaussian FIR filter, then the amount of power required for the ROM in the compensated scenario is less than that required of the uncompensated scenario. This important result is a perhaps unexpected benefit, beyond bandwidth compensation, that is enabled by the digital compensation technique of the invention.

Figure 7:
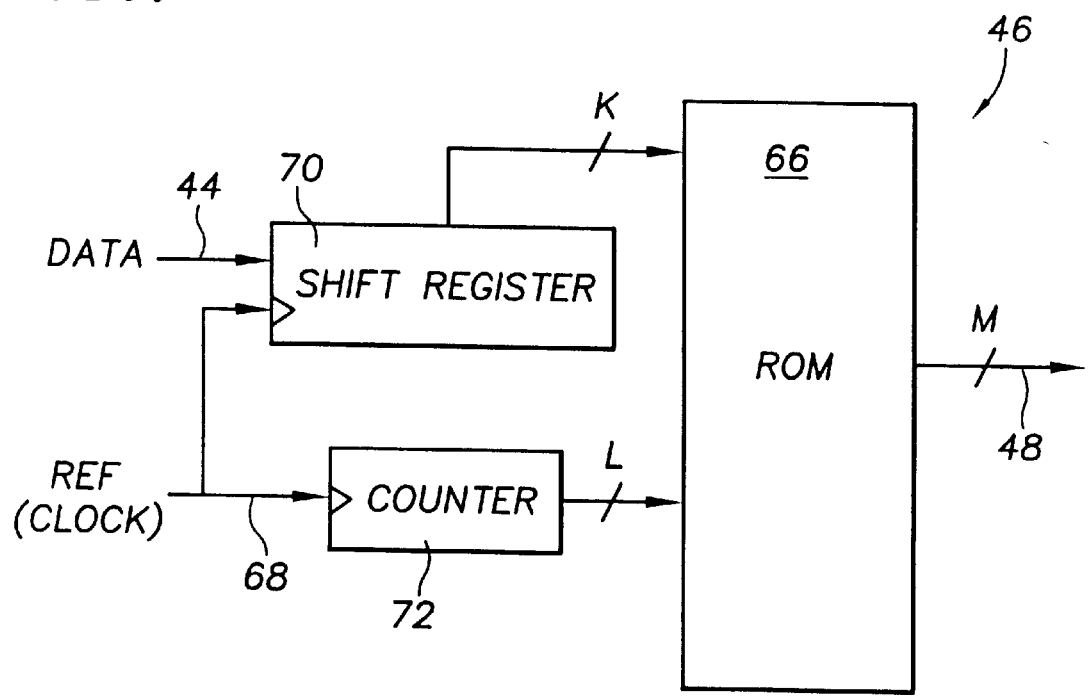
FIG. 7 is a schematic diagram of a digital implementation of the compensated Gaussian transmit filter of FIG. 6C.

Referring to FIG. 7 there is shown an example ROM implementation of the compensated Gaussian transmit filter provided by the invention. Appendix A provides a MATLAB software technique for determining the compensated Gaussian filter transfer function. The digital filtering operations to implement this function are carried out with a look-up table (LUT) that is preferably implemented in a ROM 66 for mapping current and previous digital modulation data samples, based on the reference clock signal 68, to an output signal 48 that represents a convolution of the input data with the compensated Gaussian transmit filter transfer function. Given that the compensated filter is FIR in nature, the number of modulation data samples that must be considered for a given mapping operation is finite and can be accommodated in a ROM LUT. A shift register 70 having K taps enables storage of the requisite number, K, of sequential input data samples for a given LUT mapping operation. An L-bit counter 72 provides time information for the LUT mapping operation.

In this configuration, the ROM 66 correspondingly has K+L address lines that are controlled by the K modulation data sample bits and the L counter bits. The number of bits, M, of the mapped output signal 48 is preferably selected to be high enough that an acceptably low level of $\Sigma$-$\Delta$ modulator quantization noise is introduced; the $\Sigma$-$\Delta$ modulator is included in implementation of the PLL divider, and will be described in detail below. This quantization noise is distinct from that created by the $\Sigma$-$\Delta$ modulator, and results from truncation of the convolved output samples to discrete levels. Unlike the $\Sigma$-$\Delta$ modulator noise, this quantization noise can be assumed to have a flat spectral density, while the $\Sigma$-$\Delta$ modulator noise is shaped into high frequencies. While the ROM-induced noise further adds to the $\Sigma$-$\Delta$ modulator noise, it is found that assuming a $\Sigma$-$\Delta$ modulator of 16 input bits and 6 output bits, and given that the least significant bit of the ROM is aligned with the least significant bit of the $\Sigma$-$\Delta$ modulator input, then the ROM-induced noise is only $(\frac{1}{2}^{10})^2$ times the $\Sigma$-$\Delta$ modulator noise; this very low noise input is not a function of the compensation filter and thus indicates that the compensation filter has very little impact on the noise level of the PLL system.

Referring back to FIG. 2A, at the output of the ROM, the mapped output signal 48 is then summed 50 with the carrier signal 52 to produce a modulated carrier signal. Other considerations for a ROM-based transmit filter implementation are described by Riley et al., in "A Simplified Continuous Phase Modulator Technique," IEEE Trans. Cir. & Sys.—II: Analog and Digital Processing, V. 4, N. 5, pp. 321–328, May 1994. As can be recognized, there exist a wide range of both hardware-based and software-based implementations that are suitable for the compensation filter function and the compensated Gaussian filter function provided by the invention. For example, a FIR Gaussian transmit filter function can be implemented in ROM, with a following FIR filter, or an IIR filter, implemented as a digital filter, provided for implementing the compensation function. Similarly, a FIR Gaussian transmit filter can be implemented as a digital filter, followed by a FIR or an IIR filter, implemented as a digital filter, provided for implementing the compensation function. A Gaussian transmit IIR filter could also be implemented, with a FIR or an IIR filter implementation for the compensation filter function. The reduced complexity and other factors discussed earlier result in implementation of a Gaussian FIR filter function that is adapted to include the compensation function being the preferred implementation.

The continuous-phase modulated carrier signal produced by the summation process at the output of a given filtering implementation is then input to the PLL feedback loop divider for indirect modulation of the PLL, as generally described previously. As specified with reference to FIG. 2A, in one example feedback loop divider implementation in accordance with the invention, the modulated carrier signal is input to a digital $\Sigma$-$\Delta$ modulator that controls a multi-modulus divider connected in the PLL feedback loop. The $\Sigma$-$\Delta$ modulator cooperates with the multi-modulus divider to enable the well-known fractional-N synthesis technique for producing a PLL divide value, N, that is not constrained to be an integer. Specifically, the fractional-N synthesis technique employs dithering operations to achieve non-integer PLL divide values by dynamically changing the divide value of the divider over time. As explained by Riley, in U.S. Pat. No. 4,965,531, issued Oct. 23, 1990, and entitled "Frequency Synthesizers Having Dividing Ratio Controlled by Sigma-Delta Modulator," the entirety of which is hereby incorporated by reference, this overcomes the severe limitation on resolution of achievable VCO frequencies that is imposed by an integer-only PLL divider. Thus, while conventional integer divide techniques can be employed, it is preferred in accordance with the invention that a fractional-N synthesis technique be implemented for enabling a more adaptable modulated PLL frequency synthesizer. The digital $\Sigma$-$\Delta$ modulator can be of any order suited for a given application, and can be implemented in any convenient topology that achieves the characteristic $\Sigma$-$\Delta$ functionality of a reduction in signal bit representation and shaping of the resulting quantization noise spectrum. The multi-modulus divider can be implemented with any number of moduli, e.g., 2, in a dual-modulus divider, or other number of moduli suitable for a given application.

Use of a multiple-bit output digital $\Sigma$-$\Delta$ modulator and multi-modulus divider for fractional-N synthesis with the digital compensation technique of the invention accommodates a wide dynamic range in the compensated modulation data. In turn this large dynamic range allows high data rates, even exceeding the PLL bandwidth by an order of magnitude, to be achieved. As explained previously in connection with FIGS. 5A–5B, this then allows the PLL bandwidth to be set low enough to achieve good noise performance simultaneously with achievement of high modulation data rates. In other words, this enables an order of magnitude higher modulation data rate to be accommodated with a given noise performance level.

Figure 8A:
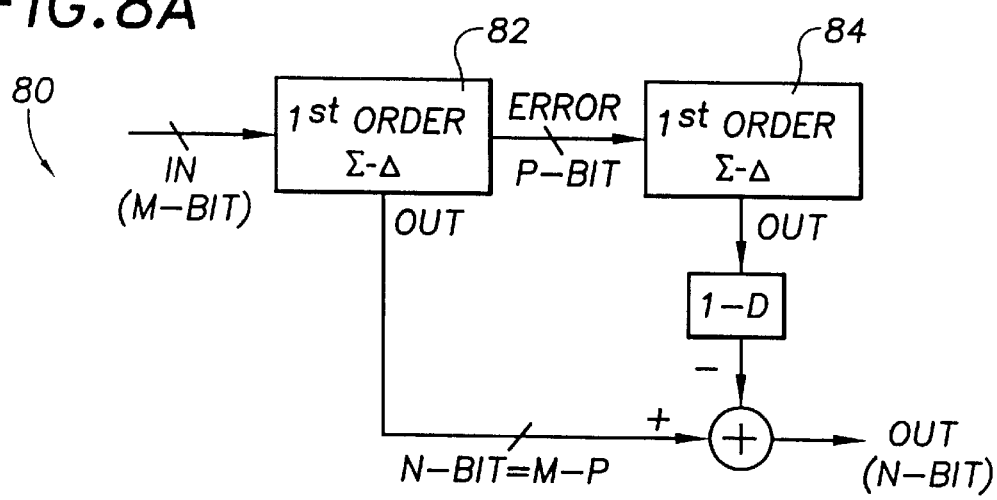
FIG. 8A is a schematic diagram of a second order MASH Σ-Δ modulator implemented in accordance with the invention.

Referring to FIG. 8A, there is shown one $\Sigma$-$\Delta$ modulator provided in accordance with the invention, namely, a second order MASH 93 -$\Delta$ modulator. The MASH configuration, as described in *Oversampling Delta-Sigma Data Converters—Theory, Design, and Simulation*, Edited by Candy et al., IEEE Press, 1992, includes a cascade of low order, e.g., first order, single loop $\Sigma$-$\Delta$ modulators that together result in an overall higher order for the cascade. The MASH configuration is preferred for fractional-N synthesis over the more conventional single loop $\Sigma$-$\Delta$ modulator configuration in that the MASH configuration has a high input dynamic range, is unconditionally stable at higher orders, and accommodates a pipelined architecture, described below, which is characterized by a power requirement that can be 1–2 orders of magnitude less than the power requirement of a conventional single loop configuration.

The particular order selected for the MASH configuration is preferably based on the order of the PLL and on the noise performance desired for a given application. In the case of a second order PLL, the preferred embodiment given here, a second order MASH leads to that portion of transmitter output noise derived from the MASH quantization noise having a rolloff of –20 dB/dec at frequencies between the phase locked loop cutoff frequency, $f_o$ and the data sample rate, 1/T. This advantageously matches the rolloff characteristics of LC-type VCOs.

Figure 8B:
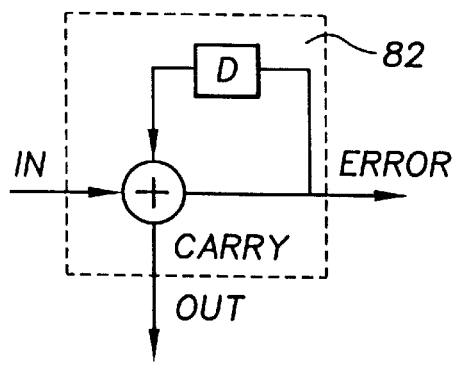
FIG. 8B is a schematic diagram of one of the stages of the MASH shown in FIG. 8A.

As shown in the figure, the two-stage MASH cascade includes two $\Sigma$-$\Delta$ modulators 82, 84, each implemented as a first order single loop modulator, as shown in FIG. 8B. In each loop, an accumulator adds the loop input, e.g., the 16-bit modulated carrier input, at a given clock cycle with a number of the least significant bits, e.g., 10 bits, of the accumulator output from the previous clock cycle; the remaining most significant bits, e.g., 6 bits, generated by this addition are output for controlling dithering of the divide value of the PLL divider. This first order loop operates, in effect, as an integrator with feedback of only the selected least significant bits.

In the cascade MASH architecture, the M-bit, e.g., 16-bit, modulated carrier signal to be introduced to the PLL is input to the first stage, which generates a first error output of least significant bits, e.g., a 10-bit error output, corresponding to quantization noise of the accumulator operation, and this lower resolution error signal is sent to the input of the following cascade stage. The remaining more significant bits generated by the accumulator of the stage are output as the carry indicator of that stage. The carry output of each stage is filtered by an FIR filter having a transfer function that corresponds to the cascade stage number, with zero given as the first stage number. The overall MASH output is then computed from each stage output in an open loop fashion to produce a dithered divide value for the PLL multi-modulus divider.

While the MASH configuration of FIG. 8A can be employed, it is preferred in accordance with the invention that this configuration be adapted to a pipelined architecture for reduction of power consumption by the $\Sigma$-$\Delta$ modulator. It has been recognized by the inventors herein that in a monolithic implementation, e.g., CMOS implementation, of PLL componentry, an increase in the maximum propagation delay, $T_{delay}$, through the CMOS componentry that can be accommodated by the componentry under correct operating conditions leads to a corresponding drop in the required CMOS supply voltage. Specifically, the energy required for each CMOS transition is found to drop off rapidly as the maximum allowable propagation delay is increased, based on relaxation of required capacitor discharge times.

Accordingly, it is found that by performing computations such as the MASH computations in parallel, rather than serially, the maximum allowable MASH propagation delays can be increased, leading to a large reduction in MASH power consumption. The MASH architecture is particularly amenable to pipelining in that latency due to pipeline delays does not destabilize the MASH operation.

Figure 9A:
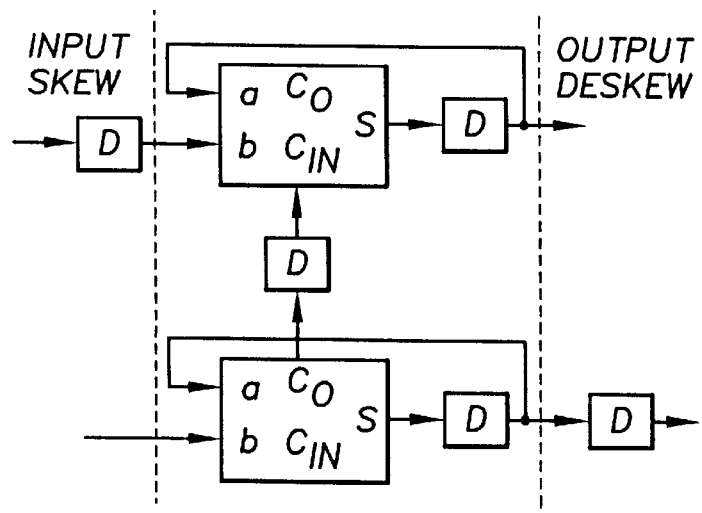
FIG. 9A is a schematic diagram of a pipelined integrator implementation of the MASH implementation of FIG. 8A.

FIG. 9A schematically illustrates a two-stage MASH integrator cascade adapted for pipelining. The "carry chain" output from the stages is pipelined, and the output of the integrator or adder from each stage is also pipelined. As shown in the figure, the two accumulators of the stages, here shown as integrators, are pipelined with a delay, D, implemented as, e.g., a register, interposed between each integrator. This delay minimizes the necessary propagation delay of the system by preventing the need for information to propagate through the entire cascade during a single clock cycle. The net delay can then be reduced to the delay associated with one stage if every bit is pipelined. In a preferred implementation, however, every two bits are pipelined to reduce the number of registers needed by a factor of about 2 over the case in which every bit is pipelined. The input to the stages is skewed with appropriate delays, to accommodate the corresponding pipeline delay; the output similarly is de-skewed with a mirror delay implementation to produce an aligned output.

Figure 9B:
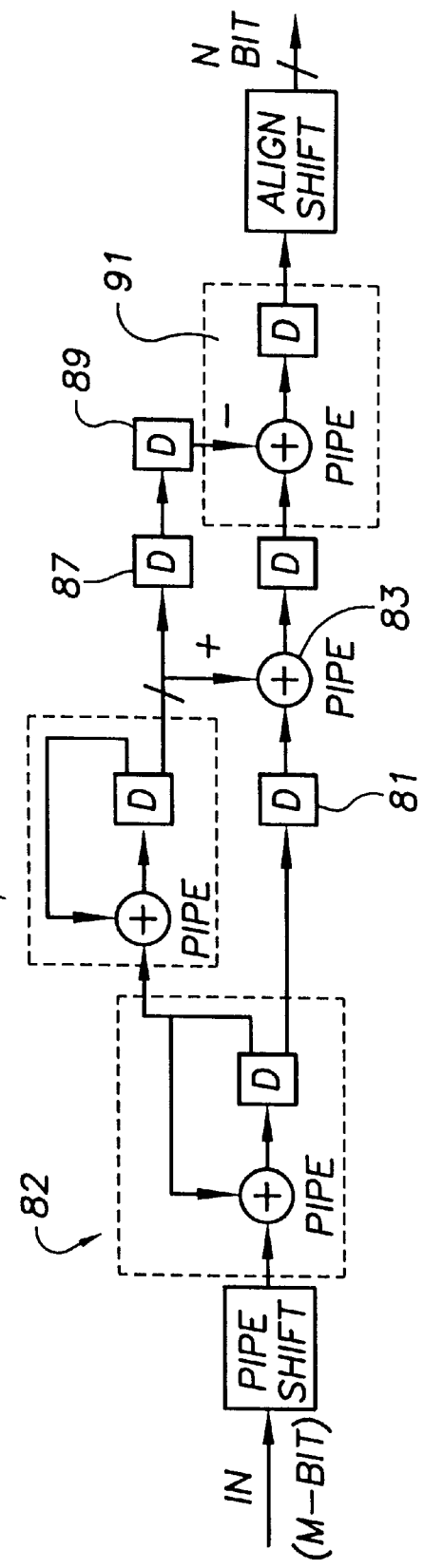
FIG. 9B is a schematic diagram of a pipelined architecture for the MASH implementation of FIG. 8A.

FIG. 9B schematically illustrates a detailed view of the MASH of FIG. 8A, with pipelined adders and integrators provided in the manner of FIG. 9A. In the figure, pipelined adders that enable bit level pipelining of, e.g., 2 bits, as is preferred, are each indicated as a "Pipe." Proceeding from left to right, the M-bit input is first skewed to align the delays of its individual bits to the delayed carry information in the pipelined adders, i.e., "Pipes," that follow. The outputs of the two pipelined loops 82, 84, are matched in time by an extra delay element 81, and then added together with an additional Pipe 83. To complete the filtering operation acting on the output of the second stage 84, that filtering corresponding to "1-D," a delayed version of the output of the second stage 84 is subtracted with an additional delay. This delay is introduced with an additional delay element 87. One further delay element 89 is provided to further delay the second stage output to compensate for the delay incurred in producing the output of the additional Pipe 83. Once propagating through the dual delay elements, the subtraction is completed in a final pipelined adder 91. The output of this adder 91 is then de-skewed and sent to the multi-modulus divider input.

Figure 10A:
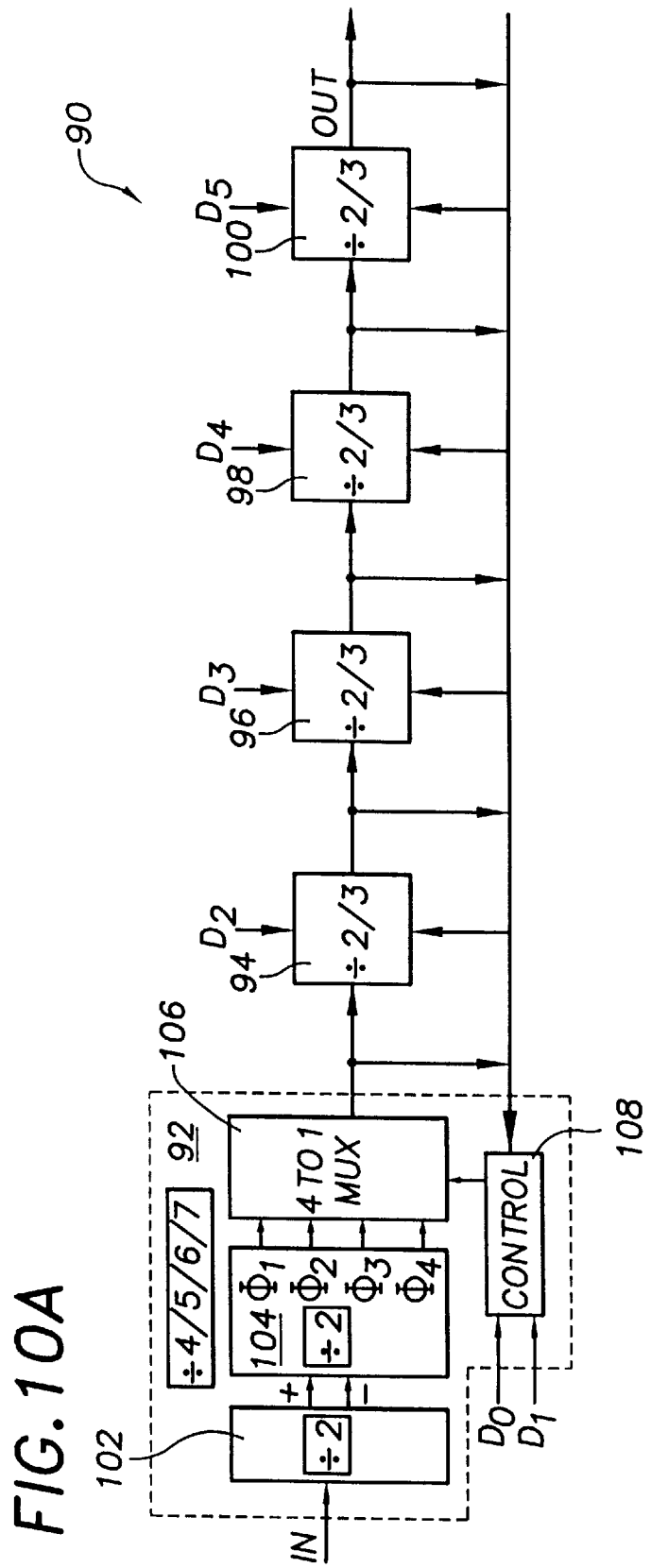
FIG. 10A is a schematic diagram of a multi-modulus divider implementation in accordance with the invention for fractional-N synthesis with the MASH implementation of FIG. 9B.

Turning to implementation of the multi-modulus divider, it is preferred that whatever divider configuration is used, that configuration provide a contiguous range of divide values across a span of values that is wide enough to accommodate the signal swing of the modulation data and range of carrier frequencies. In one multi-modulus divider implementation in accordance with the invention, as shown in FIG. 10A, the divider 90 includes an initial divide stage 92 followed by a cascade of divide stages 94, 96, 98, 100, that each run asynchronously. In the example illustrated, the initial divide stage 92 implements a multi-modulus divide-by-4/5/6/7 divider, with each cascaded stage implementing a divide-by-2/3 state machine that enables an overall 64 modulus divider.

Figure 10B:
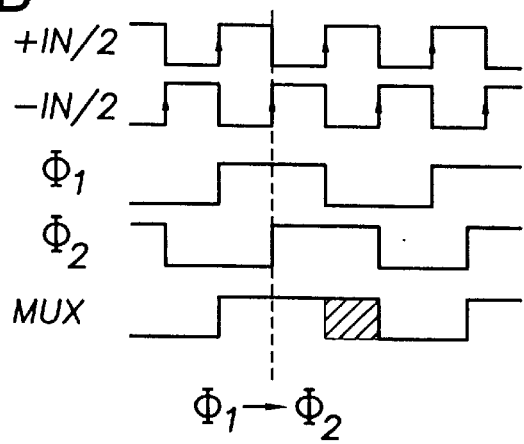
FIG. 10B is a plot of the intermediate and output signals of the first divider stage of the multi-modulus divider of FIG. 10A.
Figure 10C:
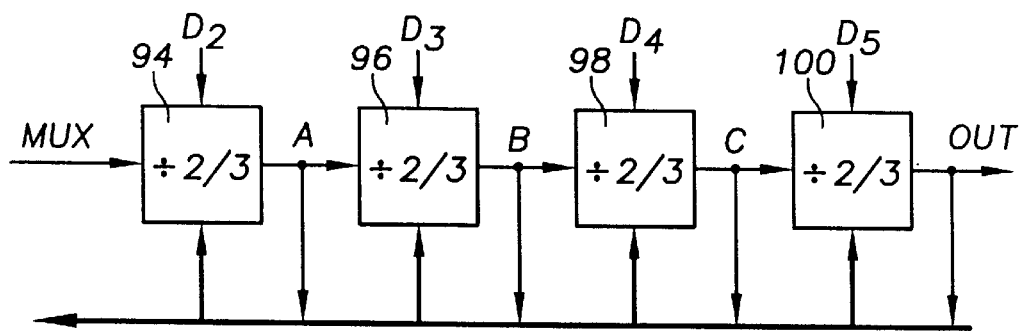
FIG. 10C is a schematic diagram of the divide-by-2/3 state machine cascade of the multi-modulus divider of FIG. 10A.

Referring also to FIG. 10C, the divide-by-2/3 stages 94, 96, 98, 100, are each like those conventionally employed in dual-modulus dividers. Here, the "pulse swallowing" operation of such a dual-modulus divider is extended, by the cascade configuration, to enable a large, contiguous range of divide values. Specifically, the cascade configuration accommodates asynchronous operation of each stage, whereby each of the four stages can be preferably operated at a successively lower frequency, enabling an overall power reduction.

Figure 10D:
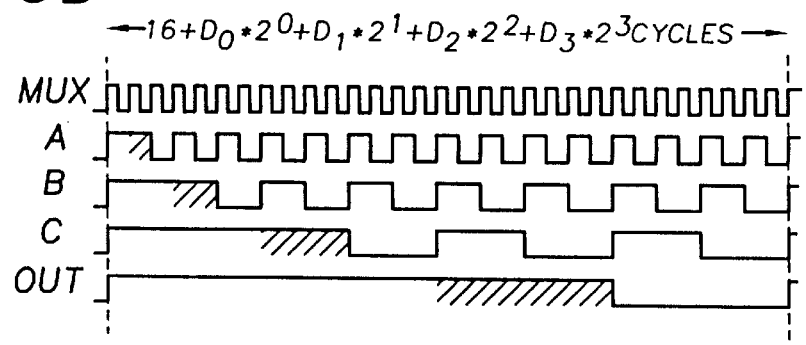
FIG. 10D is a plot of the intermediate and output signals of the divide-by-2/3 state machine cascade of FIG. 10C.

Referring also to FIG. 10D, four binary control bits $D_2$, $D_3$, $D_4$, and $D_5$, are used; assertion of a given bit results in the corresponding stage producing a divide-by-2, while de-assertion of a given bit produces divide-by-2 but "swallowing" of one cycle of that stage's input per output period, as shown in the figure. Thus, the logic in each stage operates based on the control bit state to limit that stage to one cycle "swallow" action per overall cascade period. Each cascade stage feeds its output to the next succeeding stage as well as each previous stage. With this configuration, one, two, four, or eight input cycles are "swallowed" when $D_2$, $D_3$, $D_4$, or $D_5$ are asserted, respectively. As a result, the overall cascade control is a binary weighting of the four cascaded control signals. Through appropriate setting of the control signals, any integer number of input cycles between 0 and 63 can be "swallowed" to produce a corresponding divide value.

Turning to the initial divider stage as shown in FIG. 10A, it is first noted that a divide-by-2/3 stage is typically implemented as a state machine in which several registers are clocked at the input frequency of that stage. For high frequencies of operation, it is preferable in accordance with the invention to alter this conventional topology to enable higher divider input frequencies, as well as reduced power, over that conventionally accommodated by the stage topology.

The initial divider stage 92 enables this with a topology that implements pulse "swallowing" by switching between four phases output from a cascade of divide-by-2 stages. The first such stage is a divide-by-2 prescaler 102 that can be monolithically fabricated with the other stages or if desired for a given application, can be implemented off-chip. The second divide-by-2 circuit 104, can also be implemented off-chip. A discrete implementation of the first two divide-by-2 stages would, however, be less preferable because of timing delays and the corresponding control complexity associated with control of the divide-by-2/3 stage cascade.

The operation of the divide-by-2 circuit can be understood referring also to FIG. 10B. After passing through the initial divide-by-2 prescaler, the divided input signal, +IN/2, and its inverse, −IN/2, are input to the core divide-by-2 circuit. This circuit, running at a frequency of ¼ the input signal frequency, shifts between four phases, $\Phi_1$, $\Phi_2$, $\Phi_3$, and $\Phi_4$. As seen in FIG. 10B, a shift from, e.g., the $\Phi_1$ phase to the $\Phi_2$ phase, results at the four-to-one mutliplexer output (MUX) 106 in the "swallowing" of a cycle, shown shaded, and a corresponding shift in the divider value represented by the signal.

Overall control of the initial divide-by-4/5/6/7 stage and the succeeding cascade stages of the divider is provided by a controller 108, with the $D_0$ and $D_1$ control inputs employed for synchronizing the MUX and cascade stages; because each stage is asynchronous, the MUX output must be controlled to accommodate the delay of the later stages such that the start of each cycle is aligned for a given desired divide implementation.

As can be recognized, other divider implementations, both asynchronous and synchronous, can be employed with the digital compensation technique of the invention. For example, a cascade of an asynchronous divider and a programmable synchronous divider can be employed; a programmable synchronous divider can be employed; or other suitable divider, as suited for a given application.

Turning now to the other components of the PLL, and referring back to FIG. 2A, the phase-frequency detector (PFD) 36 of the PLL can be implemented in any suitable topology that enables accurate phase comparison of a divided VCO output and the reference frequency source. The output difference signal 38 of the PFD is directed to the low pass loop filter 40 for smoothing. This low pass filter can be implemented in a suitable configuration that produces a desired low pass characteristic.

Figure 11A:
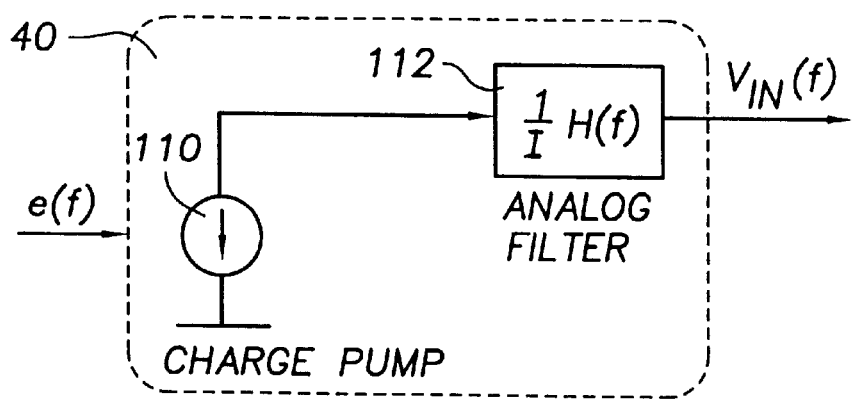
FIG. 11A is a schematic diagram of a phase locked loop filter implemented in accordance with the invention.
Figure 11B:
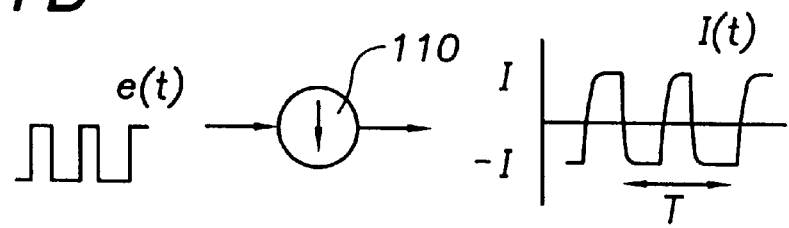
FIG. 11B is a plot of signals input and output from a charge pump implemented in the loop filter of FIG. 11A in accordance with the invention.

In one example embodiment in accordance with the invention, as shown in FIG. 11A, the PFD output signal, e(f), is input to the PLL loop filter, 40 here implemented to include a charge pump 110 and an analog filter 112. In general, as shown in FIG. 11B, the charge pump produces a signal consisting of current pulses with a duty cycle that corresponds to the phase difference detected by the PFD signal during a time period, T, between the two current levels, I(t) and −I(t). The analog filter 112 filters this pulsed signal to produce a VCO input control voltage signal, $V_{IN}(f)$ that controls the VCO frequency. Specific details of the charge pump implementation will be discussed below.

The average value of the current pulses input to the analog filter in one period is preferably a linear function of the PFD signal duty cycle; any significant nonlinearities can distort the carrier signal modulation. High linearity can be achieved when the modulation data does not result in current pulses having a width shorter than the transient time associated with the pulse transitions. However, in a scenario in which the modulation data results in current pulses that are too short, the peak current pulse amplitudes will be less than the desired +I or −I, and will result in distortion of the average current directed to the analog filter.

Assuming a symmetry in the modulation data swing, then a 50% duty cycle is preferred for the PFD-generated phase difference signal to achieve a maximum data swing without creating pulses that are shorter than the transient time that exists for pulses. A PFD configured to produce this signal can be implemented in any convenient topology, as is conventional, and can employ a digital differential structure like that described by Thamsirianunt et al., in "A 1.2 μm CMOS Implementation fo a Low-Power 900-MHz Mobile Radio Frequency Synthesizer," *IEEE* 1994 *Custom Integrated Circuits Conf.*, pp. 383–386, 1994.

Figure 12A:
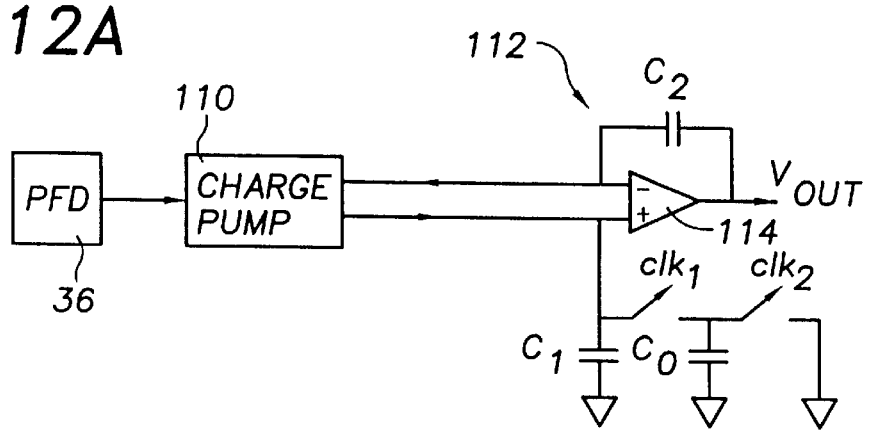
FIG. 12A is a schematic diagram of an analog filter implemented in accordance with the invention in the loop filter of FIG. 11A.

Referring also to FIG. 12A, the analog filter 112 is preferably implemented with an analog transfer function network configuration that is relatively insensitive to thermal fluctuations and process variations. This provides a level of control over the PLL transfer function such that the PLL transfer function does indeed correspond to that PLL transfer function on which the implemented digital compensation filter transfer function is based. Any operational shift in the PLL transfer function results in a mismatch between it and the digital compensation transfer function, whereby inadvertent intersymbol interference of the modulation data can occur, along with modulation deviation error.

In the preferred implementation shown in the figure, the analog filter 112 is configured as an operational amplifier network in which a desired RC time constant topology is realized using parallel switched capacitors, e.g., $C_1$ and $C_o$, rather than a more conventional series circuit. In this switched-capacitor technique, the switch rate of the two switch clocks, $clk_1$ and $clk_2$, is defined to set the desired RC time constant based on the ratio of the two capacitors, rather than their absolute values. The filter output, which is the voltage across $C_1$, is a continuous-time signal even though the RC time constant is produced by the sampling action of the switches. The rate of the $clk_1$ switch can be set to a relatively high frequency—this frequency is independent of the settling dynamics of the operation amplifier. Preferably, the $clk_1$ frequency is set at a rate equal to that of the PFD difference signal to avoid aliasing problems.

In operation, output currents from the charge pump 110 are input to the filter operation amplifier 114, which integrates one of the currents and adds that integrated current to a first-order filtered version of the other current. This first order pole is produced as a result of the fact that the filter input is a current and the filter output is a voltage. A particular benefit of the switched-capacitor technique employed to produce this filter topology is its superior ability to reduce the high frequency content of the PFD signal, given that the current is integrated by the $C_1$ element in a continuous-time manner. As a result, the voltage waveform across $C_1$ is produced as a triangle wave (ignoring noise) that has only small voltage deviations, e.g., on the order of about 40 mV. This allows the voltage across $C_1$ to be fed directly into terminal of the operation amplifier because the signal is not "bouncing around," a condition that could cause the operational amplifier to behave in a nonideal manner. Given that the clock frequency is well-controlled, as is conventional, this analog filter implementation is insensitive to temperature fluctuations that impact the capacitors, and reduces the sensitivity of the overall PLL transfer function to temperature fluctuations, whereby mismatch of the digital compensation transfer function to the PLL transfer function is correspondingly reduced.

Figure 12B:
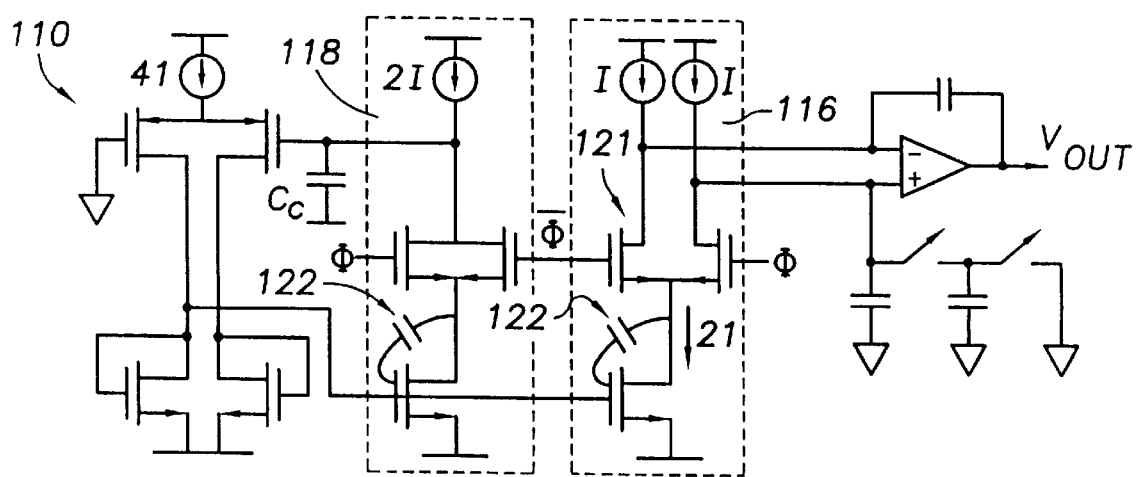
FIG. 12B is a circuit diagram of the charge pump implemented in the loop filter of FIG. 12A.

Turning to the specific charge pump implementation, and referring to FIG. 12B, the charge pump includes a pump stage 116 and a replica stage 118. The charge pump preferably is characterized by fast dynamics to avoid production of nonlinear distortion caused by current pulses that do not correspond to a given transient time. Given that the 50% duty cycle of the PFD output corresponds to zero average current, the charge pump preferably produces current pulses that alternate fully between +I and −I so that indeed the 50% duty cycle produces zero average current in operation. Due to the feedback of a type II PLL, an error in the alternating current level swing, e.g., −I and +(I+AI), can cause the duty cycle to shift away from the desired 50% value for zero average current, however.

In the charge pump configuration shown, accurately matched current levels, +I and −I, are achieved with the use of the replica stage 118, which measures the difference between the current levels and provides feedback to the charge pump 116 to adjust the tail current of the charge pump 116 accordingly. This topology achieves high speed by limiting the input voltage swing of Φ and $\overline{\Phi}$ to the minimum needed to fully switch the differential pair 121 of the charge pump 116, and by minimizing the charge pump parasitic capacitances 122.

A further technique is employed in accordance with the invention for tuning the PLL transfer function, and for specifically tuning the open loop gain, K, of the PLL transfer function to reduce its sensitivity. The open loop gain, K, is influenced by the gain of each component in the PLL and is thus influenced by relative fabrication process variations between the components. Preferably, the open loop gain is actively adjusted to compensate for variations in the gain that could lead to mismatch between the PLL transfer function and the digital compensation transfer function.

Figure 13:
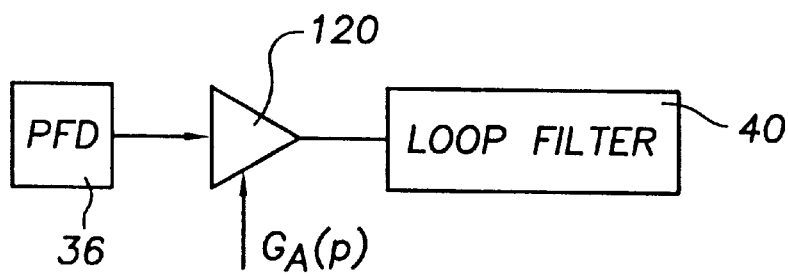
FIG. 13 is a schematic diagram of an adjustable amplifier provided in accordance with the invention to adjust the open loop gain of the phase locked loop.

In one gain tuning technique in accordance with the invention, the phase of the modulated signal input to the PLL fractional-N synthesizer is compared with the phase of the VCO output signal, and the gain of the PLL dynamics is correspondingly adjusted to compensate for any measured phase drift between the two signals. As shown in FIG. 13, the PLL gain adjustment is in one example scenario implemented as an adjustable amplifier 120 interposed between the PFD 36 and the loop filter 40. The amplifier 120 is controlled by a gain adjust signal, $G_A(p)$, that is, e.g., a 5-bit signal generated by the digital compensation and transmit filtering ROM circuitry. The amplifier 120 in turn is configured to control the loop filter charge pump 110 to adjust the absolute value of +I and −I in accordance with any measured phase difference.

In this way, the PLL transfer function open loop gain is tuned to minimize mismatch of the PLL transfer function with the corresponding parameters of the digital compensation filter. As can be recognized, this charge pump tuning is preferably only carried out when modulation data is not being transmitted. Tuning techniques similar to that employed with integrated, continuous-time filters can also be employed. In such a technique, a periodic waveform having a frequency that is the PLL cutoff frequency is injected in the digital modulation data path, while modulation is not performed. Time characteristics such as phase characteristics of the injected data are then compared with the injected data at an appropriate node in the PLL. A measurement of the actual operational PLL cutoff frequency, or other corresponding parameter, can then be made. The open loop gain is then accordingly varied until the measured operation PLL parameter, e.g., cutoff frequency, matches a desired value for that parameter.

In an alternative gain control technique, the PLL is operated to synthesize various carrier signal frequencies, without modulation of the carrier signals, and the voltage of the resulting VCO input control signal is monitored to ascertain VCO gain characteristics during the carrier signal frequency synthesis. Because the VCO typically is the largest source of PLL open loop gain variability, adjustment of the PLL open loop gain based on the VCO characteristics to achieve a desired open loop gain characteristic is quite effective. Alternatively, given access to a receiver or spectrum analyzer, the gain can also be manually controlled based on analysis of the PLL performance as indicated by an eye diagram or plot of VCO output frequency spectrum.

It is noted that the open loop gain need not be precisely set for many modulation applications. Although it is true that without open loop gain control, intersymbol interference and modulation deviation error are increased, at data rates greater than 1 Mbit/s it has been found that reasonably low levels of intersymbol interference are obtained with open loop gain errors exceeding ±25%. In addition, the modulation deviation error acceptable under the DECT standard can be as high as about 40%. Thus, gain control is not required by the invention for every application.

The remaining two PLL components, namely, the VCO and the reference frequency source, can be implemented as desired for a given application, with the stipulation that the VCO center frequency be higher than the reference frequency. One suitable VCO is the Z-COMM V602MC06. Preferably, the VCO is an integrated component designed to achieve a level of phase noise that corresponds to a desired overall system noise performance. The reference frequency source can be provided as any suitable discrete crystal oscillator or integrated oscillator employing an external crystal, or at a time available, can be provided as an integrated oscillator and crystal.

A PLL, including the pipelined MASH $\Sigma$-$\Delta$ modulator and a multi-modulus divider as described above, for indirect GFSK modulation with a compensated Gaussian transmit filter in accordance with the invention, was fabricated with a 0.6 $\mu$m CMOS process, employing double-level metal and double-level polysilicon processes. The threshold voltage for the PLL n-type devices was set at 0.75 V, and the threshold voltage for the PLL p-type devices was set at −0.88 V. A compensated Gaussian transmit filter function was determined based on the design process described earlier and in Appendix A, and was implemented in software to enable computer generation of various test modulation data streams and various compensated Gaussian transmit functions.

The software-generated compensated modulation data was introduced to the fabricated PLL chip for addition with a computer-generated carrier signal and input to the fabricated MASH $\Sigma$-$\Delta$ modulator. The PLL was successfully operated with the compensated modulation data to produce GFSK modulation of a 1.8 GHz carrier signal at a modulation data rate of at least about 2.5 Mbit/s with a PLL transfer function of only about 84 KHz. During operation, the fabricated PLL chip was found to dissipate about 27 mW of power.

Figure 14A:
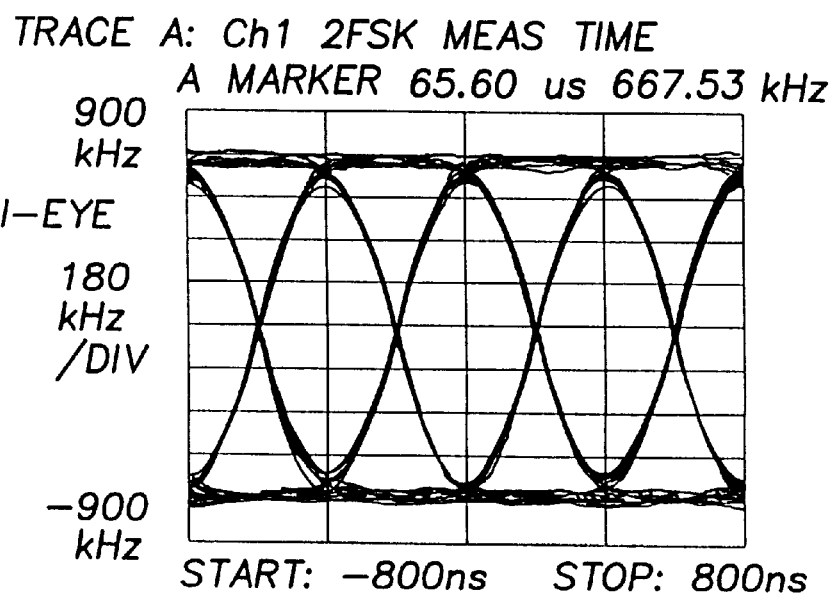
FIG. 14A is an eye diagram of a 1.8 GHz carrier signal GFSK modulated by 2.5 Mbit/s modulation data and produced by indirect modulation of a PLL in which the digital bandwidth compensation of the invention is implemented.
Figure 14B:
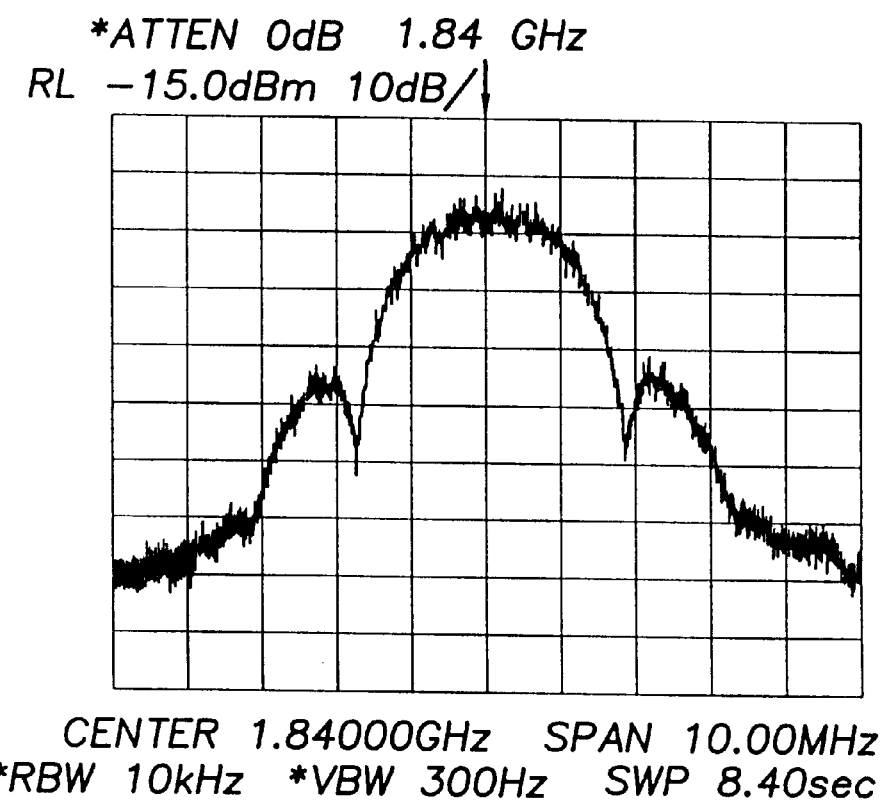
FIG. 14B is a frequency spectrum of a 1.8 GHz carrier signal GFSK modulated by 2.5 Mbit/s modulation data and produced by indirect modulation of a PLL in which the digital bandwidth compensation of the invention is implemented.

FIG. 14A is an eye diagram for the resulting 1.8 GHz carrier signal modulated by the 2.5 Mbit/s computer-generated modulation data. The full vertical expanse of the "eye" indicates excellent immunity to noise, as was expected given that the digital compensation enables a PLL loop filter having a low cutoff frequency for attenuating noise. The full horizontal expanse of the "eye" indicates excellent immunity to timing phase errors. The slope of the inside "eye lid" indicates very little sensitivity to jitter in the timing phase. Indeed, overall, the eye diagram indicates that the modulated carrier signal meets all performance criteria. FIG. 14B is the measured spectrum of the 2.5 Mbit/s modulated carrier signal, indicating that the phase noise is reduced to about −129 dBc/Hz at 5 MHz offsets from the carrier frequency. Note that at high offset frequencies the carrier phase noise is not accurately displayed due to instrument limitations. The eye diagram and frequency spectrum for the PLL output clearly demonstrate the ability of the digital compensation technique of the invention to enable indirect PLL modulation with a modulation data rate that substantially exceeds the bandwidth of the PLL loop dynamics for achieving good noise performance.

From the foregoing, it is apparent that the digital compensation techniques provided by the invention for enabling a low-bandwidth PLL to accommodate indirect modulation with high modulation data rates not only provides reliable and adaptable digital PLL bandwidth compensation, but can be implemented in a PLL system without any additional componentry. Implementation by, e.g., adapting a digital Gaussian filter to include the desired compensation transfer function is shown to be a particularly effective approach for minimizing implementation complexity, power, and cost. In concert with the various PLL transfer function tuning mechanisms preferred in accordance with the invention, the digital compensation technique is found to enable the high modulation data rates preferred from many communications applications, and accordingly, to be well-suited for the wide range of wireless communication equipment and configurations of increasing interest for commercial and personal applications. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter of the claims and all equivalents thereof fairly within the scope of the invention.

Appendix A

MATLAB Code for producing a Compensated Gaussian Filter Response
(MATLAB software package from Math Works of Natick, MA)
*********************************************************************

```
%***** select an adequate number of time samples to capture gaussian pulse
t = -14.5:14.5;
T = 1/20e6;
t = t*T;
% assume modulation data rate = 2.5 Mbit/s
modT = 1/2.5e6;
%*****gaussian pulse = N(0,sigma)
%*****sigma is related to data rate by assuming that BT_D = 0.5 (as in DECT)
sigma = 0.833/0.5*mod_r/(2*π);
%***** Compensation parameters
w_o = 2*π*84e3;
Q = .707;
%***** GFSK requires Gaussian pulse to eventually be convolved by
%***** a rectangular window of time span T -> 20 MHz/2.5 MHz = 8 samples
rect_25 = ⅛*[1 1 1 1 1 1 1 1];
%***** Gaussian pulse at relevant time samples
ga = 1/(2π*sigma)*exp(-½*(1/sigma*t).²);
%***** compensate for type II pole/zero pair:
%***** At high frequencies, low frequency pole/zero pair causes
%***** a small gain error that must be compensated for which
%***** equals f_cp/f_z at the frequencies of interest
%***** from root locus analysis, f_cp:f_z = 14/11.5 = 1.22
%***** -> multiply normalized gauss pulse (area = 1) by 1/1.22 = 0.82
ga = .82*1/norm(ga,1)*ga;
%***** the analytically derived expressions for the first and second
%***** derivatives of the gaussian pulse are calculated at the relevant
%***** sample times
ga_deriv = -t/(sigma²).*ga;
ga_sec-deriv = (-1/(sigma²) + (1/(sigma²)*t).²).*ga;
%***** subtract out means to assure that integral of compensated
%***** gaussian pulse = .82
ga_sec-deriv = ga_sec-deriv - mean(ga_sec-deriv);
ga_deriv = ga_deriv - mean(ga_deriv);
%***** add scaled versions of first and second derivatives
%***** to the Gaussian pulse
ga_fil = ga + 1/(w_o*Q)*ga_deriv + 1/w_o²*ga_sec-deriiv;
%***** Convolve compensated pulse with rectangular window
ga_fil = conv(ga_fil, rect_25);
%***** save to file
save gaussian.fil ga_fil -ascii
```

Note that the resulting compensated Gaussian pulse, $W_c(t)$ is preferably stored in ROM with a scaling factor based on the following. The resolution of the multi-modulus divider is assumed, but not limited to, 1 cycle of the VCO output. To perform GFSK, a phase shift of magnitude $\pi/2$ must be accomplished when sending the pulse $W_c(t)$ to the multi-modulus divider through the $\Sigma$-$\Delta$ modulator. As can be understood, this is true for an isolated pulse, but not necessarily true when data is processed because the convolution operation causes adjoining pulses to interact. This condition is met by scaling $W_c(t)$ in the ROM such that the integral of its samples equals ¼*0.82 of a bit at the digital $\Sigma$-$\Delta$ modulator output. The factor 0.82 is included to compensate for the gain increase caused by the parasitic pole/zero pair. The factor would not be included for an uncompensated modulator scheme because the feedback action sets the frequency deviation in such case.

We claim:

1. Apparatus for modulating a phase locked loop, the phase locked loop comprising a voltage controlled oscillator responsive to a control signal for generating an output carrier signal that is modulated by input modulation data and that has a controlled frequency; a reference frequency signal source; a phase comparator connected to receive a reference frequency signal and the modulated output carrier signal for generating a difference signal; a low pass loop filter connected to filter the difference signal for producing the voltage controlled oscillator control signal; and frequency divider means connected between the voltage controlled oscillator output and the phase comparator for dividing the output carrier signal frequency; the phase locked loop being characterized by a frequency response having a characteristic cutoff frequency; the apparatus comprising:

means for receiving from a modulation source digital input modulation data having a bandwidth that exceeds the cutoff frequency of the phase locked loop frequency response; and means coupled to the modulation data receiving means for digitally processing the input modulation data to amplify modulation data at frequencies higher than the phase locked loop cutoff frequency, and connected to the phase locked loop frequency divider means to modulate the divider means based on the digitally-processed input modulation data, whereby the voltage controlled oscillator is controlled to produce a modulated output carrier signal having a modulation bandwidth that exceeds the phase locked loop cutoff frequency.

2. The apparatus of claim 1 wherein the means for digitally processing the input modulation data is adapted to amplify the input modulation data, at frequencies higher than the phase locked loop cutoff frequency, by a selected gain factor that corresponds to an attenuation factor characteristic of the phase locked loop frequency response at frequencies higher than the phase locked loop cutoff frequency.

3. The apparatus of claim 2 wherein the phase locked loop frequency response attenuation factor to which the digital processing gain factor corresponds is based on a dominant pole in the phase locked loop frequency response.

4. The apparatus of claim 3 wherein the first-order pole in the phase locked loop frequency response to which the digital processing gain factor corresponds is produced by a dominant pole in the low pass loop filter.

5. The apparatus of claim 1 wherein the phase locked loop frequency response cutoff frequency is less than about 1.0 MHz and wherein the carrier signal modulation bandwidth is greater than about 1.0 MHz.

6. The apparatus of claim 2 wherein the means for digitally processing the input modulation data comprises digital finite impulse response compensation filter means having a compensation frequency response characterized by the selected gain factor at frequencies higher than the phase locked loop cutoff frequency.

7. The apparatus of claim 6 wherein the digital finite impulse response compensation filter means comprises a digital read-only-memory circuit having a stored look-up-table for mapping a given digital modulation data sample input to the circuit to a corresponding filtered output digital modulation data value based on a convolution of the given digital modulation data sample with the digital finite impulse compensation frequency response.

8. The apparatus of claim 6 wherein the means for digitally processing the input modulation data further comprises a digital finite impulse response Gaussian filter means having a Gaussian frequency response characterized by a cutoff frequency that corresponds to the digital modulation data bandwidth, for filtering the digital input modulation data to enable Gaussian-Frequency-Shift-Keyed modulation of the voltage controlled oscillator output carrier signal.

9. The apparatus of claim 6 wherein the digital finite impulse response compensation filter means is adapted to have a compensated Gaussian frequency response corresponding to a convolution of the compensation frequency response with a Gaussian frequency response characterized by a cutoff frequency that corresponds to the digital modulation data bandwidth, for filtering the digital input modulation data to enable Gaussian-Frequency-Shift-Keyed modulation of the voltage controlled oscillator output carrier signal.

10. The apparatus of claim 9 wherein the digital finite impulse response compensated Gaussian filter means comprises a digital read-only-memory circuit having a stored look-up-table for mapping a given digital modulation data sample input to the circuit to a corresponding filtered output digital modulation data value based on a convolution of the given digital modulation data sample with the digital finite impulse compensated Gaussian frequency response.

11. The apparatus of claim 1 wherein the phase locked loop frequency divider means comprises a multi-modulus frequency divider connected to receive the digitally-processed digital input modulation data for modulating the divider modulus.

12. The apparatus of claim 11 wherein the multi-modulus frequency divider comprises a fractional-N synthesizer, where N is the frequency divider modulus.

13. The apparatus of claim 12 wherein the fractional-N synthesizer comprises a digital $\Sigma$-$\Delta$ modulator connected to receive the digitally-processed digital input modulation data for producing a modulated digital modulus control signal, the multi-modulus divider connected to receive the control signal for controlling the divider modulus.

14. The apparatus of claim 13 wherein the digital $\Sigma$-$\Delta$ modulator comprises a cascade of digital $\Sigma$-$\Delta$ modulator loops, each loop of an order, L, that is less than an order, M, of the cascade of loops together, the cascade producing the modulated digital modulus control signal.

15. The apparatus of claim 14 wherein the cascade of digital $\Sigma$-$\Delta$ modulator loops comprises a pipelined cascade of digital $\Sigma$-$\Delta$ modulator loops, each cascaded loop including a delay means for accommodating pipelining of the production of the modulated digital modulus control signal.

16. The apparatus of claim 4 wherein the low pass loop filter comprises an analog filter circuit having a characteristic RC time constant that produces the first-order pole in the phase locked loop frequency response.

17. The apparatus of claim 16 wherein the analog filter circuit comprises a switched-capacitor network for producing the low pass filter RC time constant.

18. The apparatus of claim 2 further comprising an open loop gain controller connected to the low pass loop filter for adjusting open loop gain of the phase locked loop to obtain a prespecified phase locked loop frequency response.

19. Apparatus for modulating a phase locked loop, the phase locked loop comprising a voltage controlled oscillator responsive to a control signal for generating an output carrier signal that is modulated by input modulation data and that has a controlled frequency; a reference frequency signal source; a phase comparator connected to receive a reference frequency signal and the modulated output carrier signal for generating a difference signal; a low pass loop filter connected to filter the difference signal for producing the voltage controlled oscillator control signal; and frequency divider means connected between the voltage controlled oscillator output and the phase comparator for dividing the output carrier signal frequency; the phase locked loop being characterized by a frequency response having a characteristic cutoff frequency; the apparatus comprising:

means for receiving from a modulation source digital input modulation data having a bandwidth that exceeds the cutoff frequency of the phase locked loop frequency response; and digital filter means connected to receive the digital input modulation data for digitally filtering the input modulation data based on a Gaussian finite impulse frequency response with a cutoff frequency corresponding to the digital modulation data bandwidth and a gain characteristic for amplifying modulation data at frequencies higher than the phase locked loop cutoff frequency, the digital filter means connected to the phase locked loop frequency divider means to modulate the divider means based on the digitally-filtered input modulation data, whereby the voltage controlled oscillator is controlled to produce Gaussian Frequency Shift Keyed modulation of the output carrier signal with a modulation bandwidth that exceeds the phase locked loop cutoff frequency.

20. A phase locked loop frequency synthesizer, characterized by a frequency response having a characteristic cutoff frequency, for modulating a carrier signal having a controllable carrier signal frequency, the phase locked loop comprising:

a voltage controlled oscillator responsive to a control signal for generating an output carrier signal that is modulated by input modulation data and that has a controlled frequency;

a reference frequency signal source;

a phase comparator connected to receive a reference frequency signal from the reference frequency signal source and for receiving the modulated output carrier signal for generating a difference signal;

a low pass loop filter connected to filter the difference signal for producing the voltage controlled oscillator control signal;

frequency divider means connected between the voltage controlled oscillator output and the phase comparator for dividing the output carrier signal frequency;

means for receiving from a modulation source digital input modulation data having a bandwidth that exceeds the cutoff frequency of the phase locked loop frequency response; and Gaussian transmit filter means coupled to the modulation data receiving means for digitally processing the digital input modulation data to apply a Gaussian finite impulse response to the digital input modulation data and to amplify modulation data at frequencies higher than the phase locked loop cutoff frequency, the Gaussian transmit filter means connected to the phase locked loop frequency divider means to modulate the divider means based on the digitally-processed input modulation data, whereby the voltage controlled oscillator is controlled to enable Gaussian Frequency Shift Keyed modulation of the output carrier signal, the carrier signal modulation bandwidth exceeding the phase locked loop cutoff frequency.

21. A method for modulating a phase locked loop, the phase locked loop comprising a voltage controlled oscillator responsive to a control signal for generating an output carrier signal that is modulated by input modulation data and that has a controlled frequency; a reference frequency signal source; a phase comparator connected to receive a reference frequency signal and the modulated output carrier signal for generating a difference signal; a low pass loop filter connected to filter the difference signal for producing the voltage controlled oscillator control signal; and frequency divider means connected between the voltage controlled oscillator output and the phase comparator for dividing the output carrier signal frequency; the phase locked loop being characterized by a frequency response having a characteristic cutoff frequency; the method comprising the steps of:

receiving from a modulation source digital input modulation data having a bandwidth that exceeds the cutoff frequency of the phase locked loop frequency response;

digitally processing the digital input modulation data to amplify modulation data at frequencies higher than the phase locked loop cutoff frequency; and modulating the phase locked loop divider means based on the digitally-processed digital input modulation data, whereby the voltage controlled oscillator is controlled to produce a modulated output carrier signal having a modulation bandwidth that exceeds the phase locked loop cutoff frequency.

22. The method of claim 21 wherein the step of digitally processing the digital input modulation data comprises a step of digitally filtering the digital input modulation data based on a digital finite impulse compensation frequency response characterized by a selected gain factor, at frequencies higher than the phase locked loop cutoff frequency, that corresponds to an attenuation factor characteristic of the phase locked loop frequency response at frequencies higher than the phase locked loop cutoff frequency.

23. The method of claim 22 wherein the step of digitally filtering the digital input modulation data comprises a step of Gaussian digital filtering of the input modulation data based on a digital finite impulse Gaussian compensation frequency response corresponding to a convolution of the compensation frequency response and a Gaussian frequency response characterized by a cutoff frequency that corresponds to the digital modulation data bandwidth, to enable Gaussian-Frequency-Shift-Keyed modulation of the voltage controlled oscillator output carrier signal.

24. Apparatus for modulating a phase locked loop, the phase locked loop comprising a voltage controlled oscillator responsive to a control signal for generating an output carrier signal that is modulated by input modulation data and that has a controlled frequency; a reference frequency signal source; a phase comparator connected to receive a reference frequency signal and the modulated output carrier signal for generating a difference signal; a low pass loop filter connected to filter the difference signal for producing the voltage controlled oscillator control signal; and frequency divider means connected between the voltage controlled oscillator output and the phase comparator for dividing the output carrier signal frequency; the phase locked loop being characterized by a frequency response having a characteristic cutoff frequency; the apparatus comprising:

means for receiving from a modulation source digital input modulation data having a bandwidth that exceeds the cutoff frequency of the phase locked loop frequency response; and digital filter means connected to receive the digital input modulation data for digital filtering of the input modulation data based on a gain characteristic defined to compensate for low pass loop filter attenuation of input modulation data at frequencies higher than the phase locked loop cutoff frequency, the digital filter means connected to the phase locked loop frequency divider means to modulate the divider means based on the digitally-filtered input modulation data.

25. A phase locked loop frequency synthesizer, characterized by a frequency response having a characteristic cutoff frequency, for modulating a carrier signal having a controllable carrier signal frequency, the phase locked loop comprising:

a voltage controlled oscillator responsive to a control signal for generating an output carrier signal that is modulated by input modulation data and that has a controlled frequency;

a reference frequency signal source;

a phase comparator connected to receive a reference frequency signal from the reference frequency signal source and for receiving the modulated output carrier signal for generating a difference signal;

a low pass loop filter connected to filter the difference signal for producing the voltage controlled oscillator control signal;

frequency divider means connected between the voltage controlled oscillator output and the phase comparator for dividing the output carrier signal frequency;

means for receiving from a modulation source digital input modulation data having a bandwidth that exceeds the cutoff frequency of the phase locked loop frequency response; and digital filter means coupled to the modulation data receiving means for digital filtering of the input modulation data based on a gain characteristic defined to compensate for low pass loop filter attenuation of input modulation data at frequencies higher than the phase locked loop cutoff frequency, the digital filter means connected to the phase locked loop frequency divider means to modulate the divider means based on the digitally-filtered input modulation data.

* * * * *